(12) United States Patent
Noll et al.

(10) Patent No.: US 12,230,522 B2
(45) Date of Patent: Feb. 18, 2025

(54) INLINE WAFER DEFECT DETECTION SYSTEM AND METHOD

(71) Applicant: Texas Instruments Incorporated, Dallas, TX (US)

(72) Inventors: Patrick David Noll, Richardson, TX (US); Suzie Ghidei, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 465 days.

(21) Appl. No.: 17/565,896

(22) Filed: Dec. 30, 2021

(65) Prior Publication Data

US 2023/0072713 A1 Mar. 9, 2023

Related U.S. Application Data

(60) Provisional application No. 63/237,789, filed on Aug. 27, 2021.

(51) Int. Cl.
| | |
|---|---|
| *H01L 21/67* | (2006.01) |
| *G06T 7/00* | (2017.01) |
| *H01L 21/66* | (2006.01) |
| *H01L 21/78* | (2006.01) |

(52) U.S. Cl.
CPC ........ *H01L 21/67288* (2013.01); *G06T 7/001* (2013.01); *H01L 21/78* (2013.01); *H01L 22/20* (2013.01); *G06T 2207/30148* (2013.01)

(58) Field of Classification Search
CPC . G06T 7/001; G06T 7/0002; H01L 21/67288; H01L 22/20
See application file for complete search history.

(56) References Cited

U.S. PATENT DOCUMENTS

| | | | | |
|---|---|---|---|---|
| 2014/0233838 A1* | 8/2014 | Amzaleg | ........... | H01L 21/67288 382/141 |
| 2019/0244336 A1* | 8/2019 | Wakisaka | ............... | G01N 21/88 |

* cited by examiner

*Primary Examiner* — Edward Chin
(74) *Attorney, Agent, or Firm* — Andrew R. Ralston; Frank D. Cimino

(57) ABSTRACT

A wafer defect detection apparatus and a method of fabricating an IC using the same. Images of a plurality of semiconductor wafers forming a wafer lot are captured at a targeted process step of a fabrication flow and preprocessed, wherein a medoid image is identified as a reference wafer image. In one arrangement, preprocessed wafer images of a semiconductor wafer lot may be analyzed for defects based on an ensemble of image analysis techniques using at least one of the reference wafer image from the wafer lot and a template patch to enhance the predictive power of defect detection.

22 Claims, 9 Drawing Sheets

INLINE WAFER DEFECT DETECTION SYSTEM AND METHOD

PRIORITY AND CROSS-REFERENCE TO RELATED APPLICATION(S)

This application claims the benefit of and priority to the following U.S. provisional patent application(s): (i) "STILLAVIS: A SEMICONDUCTOR WAFER IMAGE DEFECT DETECTION SYSTEM", Application No. 63/237,789, filed Aug. 27, 2021, in the name(s) of Patrick David Noll et al.; each of which is hereby incorporated herein by reference in its entirety.

FIELD OF THE DISCLOSURE

Disclosed implementations relate generally to the field of semiconductor fabrication. More particularly, but not exclusively, the disclosed implementations relate to an inline wafer defect detection scheme operative in association with an integrated circuit (IC) fabrication flow.

BACKGROUND

Cost-effective wafer inspection is a necessity in modern semiconductor IC fabrication. Whereas economics is a critical consideration in a commercial wafer fabrication facility, inspecting wafers is not without numerous associated costs. Example costs may typically include capital outlays for the inspection equipment as well as manufacturing costs such as, e.g., time spent on inspection itself, which slows down wafer throughput; establishment of separate review stations for tasks like verifying results, dispositioning wafer lots, and classifying defects; and costs incurred due to false positives (which may come from increased inspection sensitivity in some cases) that result in unnecessary line deviations or rework, among others. A primary goal of inline wafer inspection is to improve fab operations for overall higher yields, ensuring that flawed lots never make it to final test and that, when possible, flawed lots can be reworked.

Whereas advances in wafer inspection systems and associated defect detection methods continue to grow apace, several lacunae remain, thereby requiring further innovation as will be set forth hereinbelow.

SUMMARY

The following presents a simplified summary in order to provide a basic understanding of some examples of the present disclosure. This summary is not an extensive overview of the examples, and is neither intended to identify key or critical elements of the examples, nor to delineate the scope thereof. Rather, the primary purpose of the summary is to present some concepts of the present disclosure in a simplified form as a prelude to a more detailed description that is presented in subsequent sections further below.

Examples of the present disclosure are directed to a wafer defect detection apparatus and a method of fabricating an IC using the same. In one arrangement, images of a plurality of semiconductor wafers forming a wafer lot are captured at a targeted process step of a fabrication flow and preprocessed, wherein a medoid image is identified as a reference wafer image. In one arrangement, preprocessed wafer images of a semiconductor wafer lot may be analyzed for defects based on an ensemble of image analysis techniques using at least one of the reference wafer image from the wafer lot and a template patch to enhance the predictive power of defect detection.

In one example, a semiconductor wafer defect detection apparatus is disclosed, which comprises, inter alia, an imaging system for capturing images of a plurality of semiconductor wafers at a targeted process step of a fabrication flow, the plurality of semiconductor wafers forming a wafer lot processed through the fabrication flow; and a processing system coupled to the imaging system, the processing system including one or more processors and a persistent memory having program instructions that, when executed by the one or more processors, perform operations: preprocessing each wafer image received from the imaging system to obtain preprocessed wafer images; identifying a medoid image from the preprocessed wafer images as a reference wafer image; and determining whether a semiconductor wafer is defective after the targeted process step based on an ensemble of image analysis techniques performed on the preprocessed image of the semiconductor wafer in conjunction with at least one of the reference wafer image from the wafer lot and a template patch. In one arrangement, the program instructions may include instructions configured to preprocess a raw image of the semiconductor wafer by performing at least one of an edge mask operation, a center circle shadow replacement operation and a circle-inverted mask replacement operation with respect to the raw image of the semiconductor wafer. In one arrangement, the ensemble of image analysis techniques for analyzing the preprocessed wafer images may comprise template matching, image differencing using Gaussian blur and standard deviation kernel convolutions, and blob detection based on a Maximally Stable Extremal Regions (MSER) scheme that may be performed responsive to the convolved images obtained from Gaussian blur and standard deviation kernel convolutions. In one variation, an example MSER scheme may be performed, on a per-color channel, on a convolved image corresponding to the preprocessed image of the semiconductor wafer as well as on a differential image derived as a difference between the convolved image corresponding to the preprocessed image of the semiconductor wafer and a convolved image corresponding to the preprocessed reference wafer image.

In another example, a method of fabricating an integrated circuit (IC) is disclosed. The method comprises, inter alia, processing a semiconductor wafer in a fabrication flow having a sequence of process steps for creating at least one semiconductor die containing the IC, each process step for forming the IC on a layer-by-layer basis, the semiconductor wafer forming a substrate for the IC. During the processing of the semiconductor wafer, a wafer inspection of the semiconductor wafer may be performed in association with a targeted process step of the fabrication flow to detect whether the semiconductor wafer is defective after the targeted process step is completed. In one arrangement, the wafer inspection comprises an ensemble of image analysis techniques performed on a preprocessed image of the semiconductor wafer captured upon completing the targeted process step. Responsive to detecting that the semiconductor wafer is defective after completing the targeted process step, a determination may be made if the semiconductor wafer containing a partially formed IC is reworkable. Responsive to determining that the semiconductor wafer containing the partially formed IC is reworkable, the targeted process step may be repeated to generate a semiconductor wafer that is predicted to be defect-free. After completing the sequence of process steps, including the targeted process step, the semiconductor die containing the IC may be singulated in a wafer dicing operation for packaging. In one arrangement, an example implementation of the method may include obtaining a reference wafer image that is a medoid image selected from a plurality of wafer images captured at the targeted process step, the plurality of wafer images corresponding to respective wafers of a wafer lot in which the semiconductor wafer is placed for processing; and preprocessing the reference wafer image and utilizing the preprocessed reference wafer image in conjunction with the preprocessed image of the semiconductor wafer in one or more image analysis techniques for enhancing predictive power of the wafer inspection.

In another example, a wafer defect detection method is disclosed, which comprises, inter alia, obtaining images of a plurality of semiconductor wafers forming a wafer lot at a targeted process step of a fabrication flow through which the wafer lot is processed; preprocessing each wafer image to obtain preprocessed wafer images; identifying a medoid image from the preprocessed wafer images as a reference wafer image; and performing a wafer inspection of a preprocessed wafer image of a semiconductor wafer to detect whether the semiconductor wafer is defective after the targeted process step, the wafer inspection comprising an ensemble of image analysis techniques performed on the preprocessed image of the semiconductor wafer in conjunction with at least one of the reference wafer image from the wafer lot and a template patch.

BRIEF DESCRIPTION OF THE DRAWINGS

Implementations of the present disclosure are illustrated by way of example, and not by way of limitation, in the Figures of the accompanying drawings. It should be noted that different references to "an" or "one" implementation in this disclosure are not necessarily to the same implementation, and such references may mean at least one. Further, when a particular feature, structure, or characteristic is described in connection with an implementation, it is submitted that it is within the knowledge of one skilled in the art to effect such feature, structure, or characteristic in connection with other implementations whether or not explicitly described.

The accompanying drawings are incorporated into and form a part of the specification to illustrate one or more example implementations of the present disclosure. Various advantages and features of the disclosure will be understood from the following Detailed Description taken in connection with the appended claims and with reference to the attached drawing Figures in which:

DETAILED DESCRIPTION OF THE DRAWINGS

Figure 1:
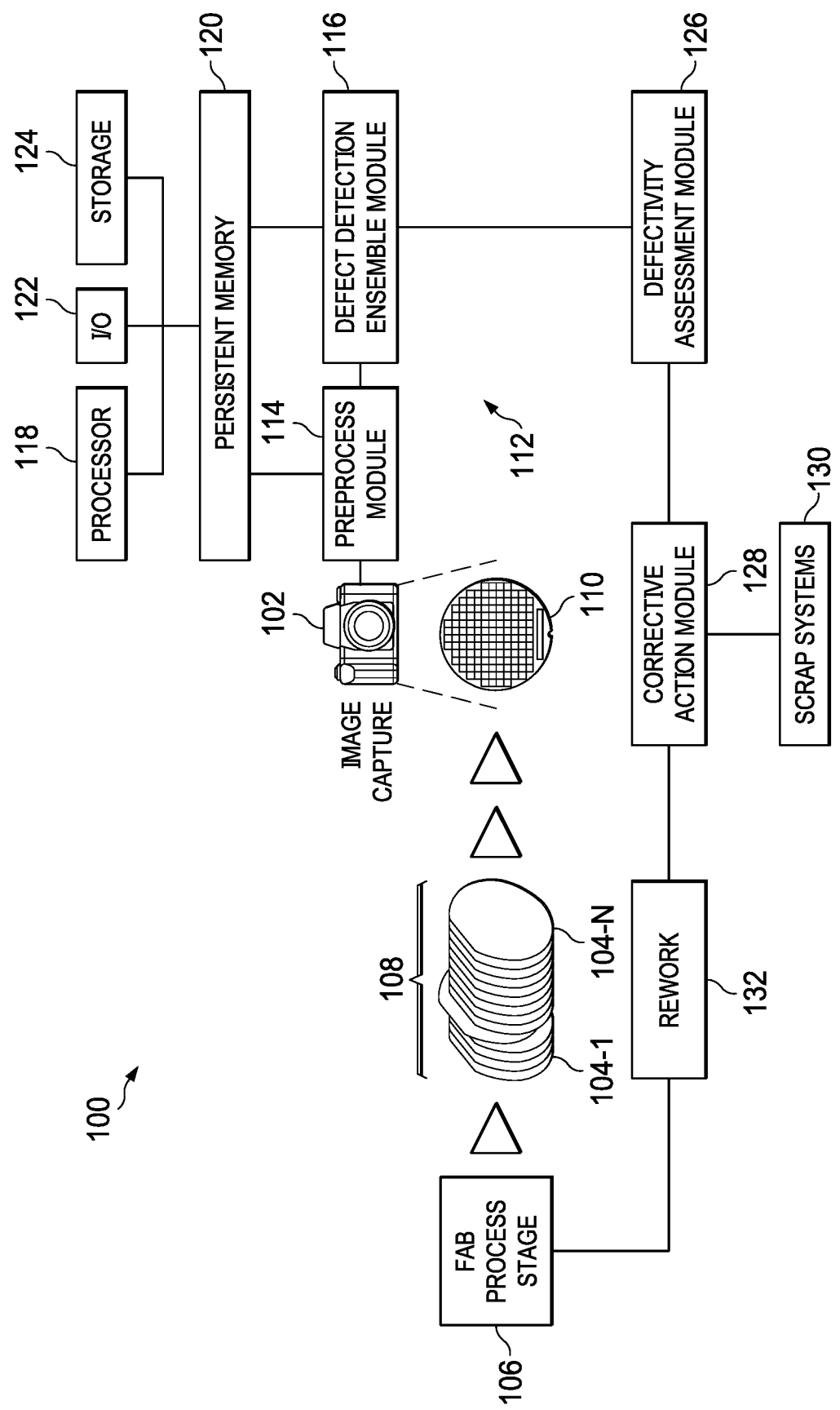
FIG. 1 depicts a representative wafer defect detection system that may be deployed in association with one or more process stages of a wafer fabrication flow according to some examples of the present disclosure.

Examples of the disclosure are described with reference to the attached Figures wherein like reference numerals are generally utilized to refer to like elements. The Figures are not drawn to scale and they are provided merely to illustrate examples. Numerous specific details, relationships, and methods are set forth below to provide an understanding of one or more examples. However, it should be understood that some examples may be practiced without such specific details. In other instances, well-known subsystems, components, structures and techniques have not been shown in detail in order not to obscure the understanding of the examples. Accordingly, it will be appreciated by one skilled in the art that the examples of the present disclosure may be practiced without such specific components.

Additionally, terms such as "coupled" and "connected," along with their derivatives, may be used in the following description, claims, or both. It should be understood that these terms are not necessarily intended as synonyms for each other. "Coupled" may be used to indicate that two or more elements, which may or may not be in direct physical or electrical contact with each other, co-operate or interact with each other. "Connected" may be used to indicate the establishment of communication, i.e., a communicative relationship, between two or more elements that are coupled with each other. Further, in one or more examples set forth herein, generally speaking, an element, component or module may be configured to perform a function if the element may be programmed for performing or otherwise structurally arranged to perform that function.

One or more examples of the present disclosure may be implemented using different combinations of software, firmware, and/or hardware. Thus, one or more of the techniques shown in the Figures (e.g., flowcharts) may be implemented using code and data stored and executed on one or more electronic devices or nodes (e.g., a workstation, a network element, etc.). Such electronic devices may store and communicate (internally and/or with other electronic devices over a network) code and data using computer-readable media, such as non-transitory computer-readable storage media (e.g., magnetic disks, optical disks, random access memory, read-only memory, flash memory devices, phase-change memory, etc.), transitory computer-readable transmission media (e.g., electrical, optical, acoustical or other form of propagated signals—such as carrier waves, infrared signals, digital signals), etc. In addition, some network elements or workstations, e.g., configured as servers, may typically include a set of one or more processors coupled to one or more other components, such as one or more storage devices (e.g., non-transitory or persistent machine-readable storage media) as well as storage database(s), user input/output devices (e.g., a keyboard, a touch screen, a pointing device, one or more imaging capturing devices and/or a display, etc.), and network connections for effectuating signaling and/or data transmission. The coupling of the set of processors and other components may be typically through one or more buses and bridges (also termed as bus controllers), arranged in any known (e.g., symmetric/shared multiprocessing) or heretofore unknown architectures. Thus, the storage device or component of a given electronic device or network element may be configured to store code and/or data for execution on one or more processors of that element, node or electronic device for purposes of implementing one or more techniques of the present disclosure.

Referring to the drawings, FIG. 1 depicts a representative wafer defect detection system or apparatus 100 that may be deployed in association with one or more process stages or steps of a wafer fabrication flow according to some examples of the present disclosure. Depending on implementation, a semiconductor manufacturing process may comprise a fabrication flow involving one or more thin-film and/or thick-film processing/deposition stages, one or more photolithography stages, chemical-mechanical polishing (CMP) stages, metallization stages, etc., among others. In an example arrangement, one or more process steps or stages may be selected, monitored, or otherwise targeted for wafer defect inspection, which may comprise any suitable fabrication stage where photographic images of inline semiconductor wafers, also referred to as semiconductor process wafers, may be captured and analyzed for identifying, detecting or otherwise predicting potential defects in the inline wafers, generally referred to as defect detection, identification and assessment, or wafer defectivity analysis for short. Based on fabrication flow management strategy, which may involve cost-benefit considerations as to wafer scrap and reworking guidelines, as well as based on institutional knowledge and domain expertise relating to which process stages are historically "defect-prone", an example wafer defect detection system 100 may be deployed during early stages, middle stages, or late stages of a frond-end-of-line (FEOL) and/or a back-end-of-line (BEOL) portion of a fabrication flow. By way of illustration, a generalized process stage 106 is exemplified in FIG. 1 that may represent a particular process stage of an example fabrication flow where a plurality of wafers 104-1 to 104-N may be batch-processed, e.g., in a wafer lot 108, that may be selected for wafer defect detection at or after completion of the process stage 106.

An image capturing system 102 may be configured to capture photographic images of each semiconductor process wafer, e.g., wafer 110, using any known or heretofore unknown image capturing hardware and software configurations, technologies, image qualities/resolutions, etc. In one example arrangement, image capturing system 102 may comprise a camera sensor or an imager that is configured to collect visible light (400-750 nanometers (nm)) off an entire wafer in its field of view (FoV) to create a substantially square or rectangular raw image that contains a circular wafer image portion corresponding to wafer 110. Without limitation, an example imager may be operative to generate a raw image of a semiconductor process wafer having a particular resolution (e.g., M×M pixels, M×N pixels and/or in some suitable aspect ratio), each pixel having three intensity values in red (R), green (G) and blue (B) wavelengths (or channels) for accurately representing the wafer image in an RGB colorspace, wherein a value of 0 representing no color and a value of 255 representing the highest level of a particular color (e.g., red, green or blue color), in a representative 8-bit digital colorspace implementation. In one configuration, the image capturing system 102 may comprise a single camera disposed at a suitable viewpoint with respect to the wafer 110 being imaged, the camera having the capability of capturing still color wafer images in a single FoV with resolutions in the range of a few thousand pixels by a few thousand pixels (e.g., images that may be considered as low resolution images). In additional and/or alternative arrangements, multiple cameras having multiple resolutions may be disposed at different viewpoints for capturing different portions of wafer 110 and piecing together a single raw wafer image. Further, imagers having the capability to capture images in black and white, grayscale, and/or other spectral portions and digital colorspace representations may be deployed in some arrangements. Regardless of how the raw wafer images are acquired, captured, generated or otherwise obtained by example image capturing system 102, they may be preprocessed to obtain preprocessed images that may be analyzed using a plurality of image analysis techniques, referred to herein as an image analysis ensemble pipeline for purposes of some examples of the present disclosure. In one arrangement, an example image analysis ensemble pipeline may be executed in a parallel or a sequential manner, or a hybrid thereof, by an image processing system 112 for purposes of wafer level defect detection and prediction as will be set forth in detail further below.

In some arrangements, example image processing system 112 may be implemented as part of a fully automated wafer inspection system that can be configured to analyze images captured at one or more targeted process stages of a fabrication process with little or no human operator intervention. In some arrangements, example image processing system 112 may be configured to operate in conjunction with additional systems including, without limitation, machine learning (ML) or deep learning (DL) systems based on neural networks, artificial intelligence (AI)-based expert systems, Big Data analytics systems, etc., as well as historical wafer image databases, and the like. By way of illustration, a computing platform, e.g., a workstation, having one or more processors 118 coupled to a persistent memory 120 containing machine-executable code or program instructions, may be configured to operate as an image processing system wherein a preprocessing module 114 and a defect detection/prediction ensemble module 116 may be provided for execution by processor(s) 118 under programmatic control in order to perform one or more image preprocessing techniques and defect detection techniques in a pipeline fashion. In an example implementation, the ensemble module 116 may comprise a plurality of image analysis techniques that may be individually optimized or otherwise tuned in order to obtain a wafer level defect detection scheme having enhanced predictive power and high level of sensitivity. Depending on implementation, example image processing system 112 may also include one or more storage modules 124 and one or more input/output (I/O) modules 112 for facilitating storage of wafer image data and interfacing with external modules, systems, or databases, etc.

In some arrangements, the defect detection/prediction ensemble module 116 may be associated with a defect assessment module 126 to provide wafer level and/or lot level defect assessments, which may in turn be provided to a corrective action module 128. In some arrangements, a determination may be made in association with the corrective action module 128, which may be facilitated by human experts and/or AI expert systems, as to whether any wafers deemed to be defective may be reworked in a cost-effective manner or not. In some arrangements, any defective wafers of wafer lot 108 determined to be reworkable may be provided to a rework system 132 (e.g., via a robot handler, not shown in this FIG.) for transferring such wafers back to the targeted fabrication process stage 106 where the defects are predicted to have been caused. On the other hand, defective wafers determined to be non-reworkable, e.g., not in a cost-effective manner, may be provided to a wafer scrap system 130.

Skilled artisans will recognize that although image capturing system 102 and image processing system 112 are exemplified in FIG. 1 as two separate entities, they may be combined, integrated or otherwise (re)configured to be deployed as a single system or a distributed/networked system in some arrangements. Likewise, image processing system 112 may be integrated with other modules and systems, e.g., including robot-controlled systems, for effectuating various wafer-related tasks in response to defect assessment operations in a fully automated manner.

Figure 2:
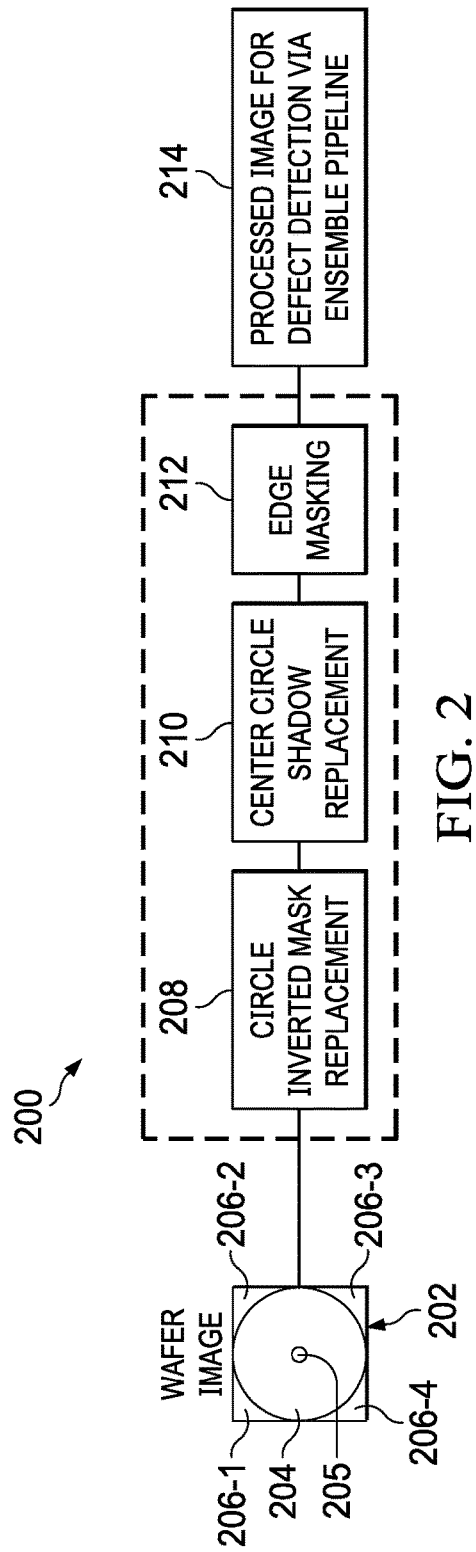
FIG. 2 depicts a block diagram of a wafer image preprocessing subsystem according to some examples of the present disclosure.

FIG. 2 depicts a block diagram of a wafer image preprocessing subsystem 200 according to some examples of the present disclosure. In one arrangement, subsystem 200 may comprise a plurality of image preprocessing modules that may be executed by a processor of an image processing system (e.g., system 112 shown in FIG. 1) under suitable program control for preprocessing raw wafer images of a wafer lot using a variety of techniques in order to yield processed wafer images that may be provided as an input to an image processing ensemble pipeline for purposes of some example implementations of the present disclosure. By way of illustration, an example raw wafer image 202 may comprise a square image that inscribes, includes, or otherwise contains a circular image portion 204 corresponding to a semiconductor process wafer, wherein various artifacts and/or pixel regions not truly representative of a wafer may be present. For example, the raw image 202 may include pixels outside the circular image portion 204 corresponding to the imaged wafer, which are exemplified by four corner regions 206-1 to 206-4 and/or any surrounding marginal lanes (not show in this FIG.). In one arrangement of an image capturing system, pixels outside the circular image portion 204 may comprise pixels having an intensity vector [0,0,0], indicating black on all three color channels. Example raw image 202 may also include a shadow region 205 located in the circular wafer image portion 204, e.g., at a center thereof, which is an artifact caused by or in some example baseline image capturing systems. Further, it is known that a wafer typically contains some partial die near its edges due to the inherent process limitations and variations with respect to processing circular wafers. Any pixel irregularities in the edge region of a wafer image may therefore be disregarded for purposes of wafer level defectivity analysis. Otherwise, the pixel irregularities of the edge may confound an imaging processing technique used in defect detection, thereby reducing its predictive power.

In one arrangement, example preprocessing system 200 may include a circle-inverted mask replacement module 208 configured to execute a pixel replacement operation with respect to the raw wafer image 202 having one or more pixel regions outside the circular wafer image portion 204, wherein the outside pixel regions, e.g., regions 206-1 to 206-4, may be replaced, pixel by pixel, with pixels having statistically representative intensity values of the pixels comprising the circular wafer image portion 204. Depending on implementation, a pixel having a mean intensity vector or some other statistical parameter may be determined for replacing the pixels of any region outside the circular wafer image portion 204.

In one arrangement, example preprocessing subsystem 200 may include a center circle shadow replacement module 210 configured to execute a pixel replacement operation with respect to the center shadow region 205 of the raw wafer image 202. In one implementation, a patch of suitable size/shape disposed in the circular wafer image portion 204 not including the shadow region 205 may be identified that is most representative of the rest of the wafer image portion 204, e.g., based on a Euclidean distance or some other metric computed on the basis of pixel intensities. In a replacement operation, the identified patch may be used as a mask or "pixel graft" for covering the center shadow region 205.

In one arrangement, example preprocessing subsystem 200 may include an edge masking module 212 configured to execute an edge masking operation with respect to one or more edge regions of the circular wafer image portion 204. Depending on implementation, pixels of an edge region may be set to a default value (e.g., a intensity vector [0,0,0]) for causing an image analysis technique used for defect detection to disregard the pixels. In some arrangements, such edge exclusion may vary depending on the type of image analysis techniques used in an example ensemble of techniques as will be set forth in detail further below.

In some example arrangements, the foregoing preprocessing techniques may be executed in any combination, order, or sequence with respect to a plurality of raw wafer images obtained from a wafer lot. In some example arrangements, a particular combination/sequence of example preprocessing techniques may be selected depending on the targeted process stage where the wafers are imaged, which image analysis techniques of an ensemble of techniques may be optimized, and the like. Further, some example implementations may involve performing one or more preprocessing techniques in association with an edge detection technique to identify different regions of a raw wafer image. In some variations, additional preprocessing may be selectively performed on the preprocessed images depending on which image analysis techniques of the ensemble may be optimized. For example, scalar multiplication of all or a portion of the pixels of a preprocessed wafer may be performed using specific scalars, e.g., that are empirically determined, in order to optimize the performance of certain image analysis techniques as will be set forth in additional detail further below. Regardless of a particular combination or sequence of the preprocessing techniques deployed in an implementation, example preprocessing subsystem 200 may be configured to generate, obtain or otherwise provide a plurality of (pre)processed images 214 from a wafer lot for performing defectivity analysis using an ensemble pipeline.

Figure 3:
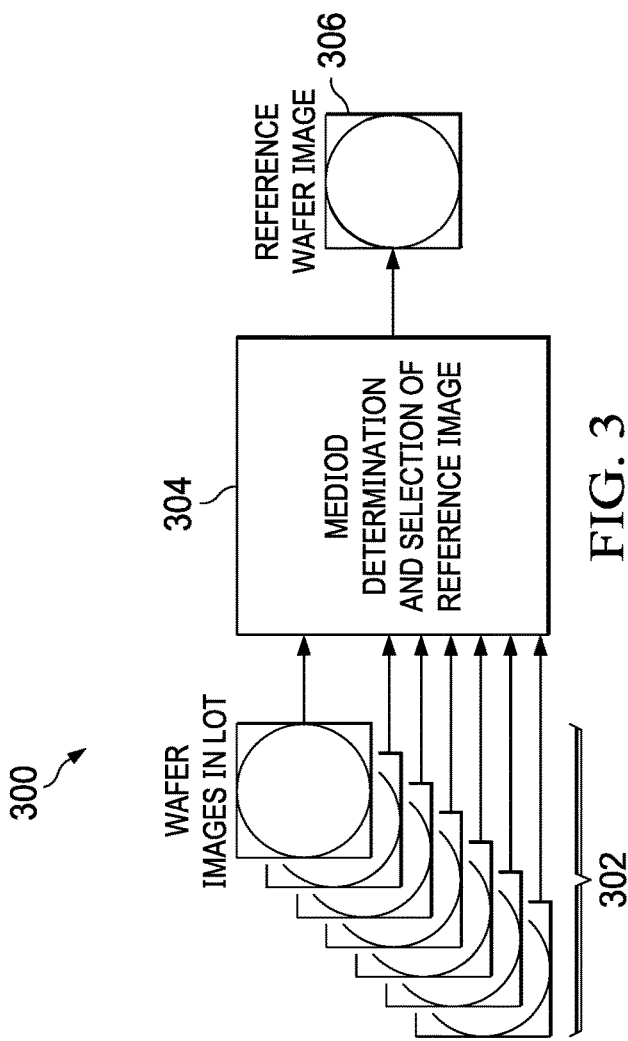
FIG. 3 depicts a block diagram of a reference wafer image selection subsystem according to some examples of the present disclosure.

In some arrangements, a reference wafer image may be determined, obtained, or otherwise provided, which may be used in association with a set of wafer images in executing one or more image analysis techniques for purposes of defect identification and assessment. FIG. 3 depicts a block diagram of a reference wafer image selection subsystem 300 according to some examples of the present disclosure. Images 302 may be representative of a plurality of preprocessed images or raw wafer images corresponding to a set of wafers in a wafer lot (e.g., 25 wafers, although any number of wafers may be used for performing defectivity analysis). Module 304 may be configured, e.g., as executable program code, to determine a medoid image from the set of images 302 that may be identified as a reference wafer image 306. In general, a medoid is a representative object of a data set or a cluster within a data set whose average dissimilarity to all the objects in the cluster is minimal. Medoids are similar in concept to means or centroids, but medoids are always restricted to be members of the data set. In one example implementation, a medoid image is a wafer image that is determined to be least distant from the remaining wafer images, e.g., having a minimum distance measured in pixel intensity based on any suitable metric distance. In one example implementation, pairwise distances may be determined using all the pairs of wafer images, which may be provided as an input to a minimization function that identifies a particular wafer image of the images 302 as having the least distance with respect to the rest of the images 302. In one arrangement, pairwise wafer image distances may be determined based on pixel-to-pixel distances determined over the RGB colorspace, which may then be used to obtain a "hypermetric distance" for the entire wafer-to-wafer distance determination.

Medoid image 306 may be used as a reference wafer image in certain image analysis techniques in an example implementation as noted above. Where there are more than one medoid image, an example implementation may be configured to select any one of the medoid images as a reference wafer image, and remove the remaining medoid images from subsequent image analysis techniques. In another example implementation, the wafer images may be partitioned into multiple clusters around each medoid image, wherein subsequent image analysis techniques may be performed on the partitioned wafer images on a cluster-by-cluster basis. Whereas baseline techniques may involve using a statistically derived artificial wafer image as a reference wafer image (e.g., having mean or medial pixel intensity at each pixel location), medoid image 306 is an actual wafer image that is generally impervious to artifacts that may be caused during image analysis due to affine differences in wafer images such as, e.g., translation, rotation, scaling, etc., which are more pronounced when artificial "doctored" reference wafer images are deployed.

In an example implementation of the present disclosure, wafer defectivity analysis may be facilitated by performing an ensemble of techniques that may be broadly grouped into three classes: (i) template matching; (ii) image differencing; and (iii) region detection (also referred to a "blob" detection) based on a Maximally Stable Extremal Regions (MSER) scheme. Whereas image differencing techniques and blob detection techniques may be based on image convolutions between a processed wafer image and a medoid image used as a reference image, template matching may be implemented based on a comparative technique using a patch of pixels (e.g., a "template") in conjunction with the processed wafer images, wherein the template is known to have a characteristic optical signature (e.g., intensity, brightness, etc.) that is representative of a group of semiconductor process wafer images determined as having no defects (or under a threshold) at or after a particular process step. In some implementations, representative templates from different process stages may be obtained or derived from historical image data, which may have been analyzed by human experts and/or AI/ML-based expert systems including, e.g., supervised or unsupervised classification techniques.

In some arrangements, image differencing techniques may be divided into two subclasses based on the type of convolutions used for smoothing: (i) Gaussian kernel convolution (also referred to as "Gaussian blur"); and (ii) standard deviation kernel convolution, which may be applied across all wafer images from a wafer lot. Likewise, blob detection techniques may also be divided into Gaussian blur convolution analysis and standard deviation kernel convolution analysis in an example implementation. Additionally, blob detection techniques may be applied to a single wafer image, e.g., to detect blobs or areas of "within wafer non-uniformity", in addition to detecting defects across all wafers in a lot. Accordingly, an example ensemble of techniques may comprise performing foregoing seven techniques, which may be executed in a pipeline, sequentially or otherwise, as previously noted, by an image processing system (e.g., system 112 shown in FIG. 1) for facilitating wafer defectivity analysis according to some implementations of the present disclosure.

For purposes of at least some examples, defects may be broadly defined as or based on deviations or variations in one or more optical characteristics of a wafer image, e.g., color, intensity, brightness, texture/granularity, etc., which may collectively be referred to as an optical signature, with respect to an expected reference signature that is known to correspond to wafers that have been processed at a targeted process stage without defects (or within a guardband). As previously noted, data regarding wafer images and associated optical signatures may be obtained as pixel vectors or triplets in an RGB colorspace using a suitable binary representation in some example implementations (e.g., using an 8-bit integer representation for each of red, blue and green color channels). The "size" of a defect may be defined as an array of pixels that exhibit some abnormality within a wafer with respect to other regions therein and/or across a group of wafers in a wafer lot. Whereas defect sizes can theoretically range from the entire wafer area to a single pixel, examples of the present disclosure may be configured to execute suitably tuned image analysis techniques wherein appropriate thresholds, kernel sizes and other parameters based on empirical/historical data, heuristics, deep learning, etc., may be used so as to achieve defect detection/prediction at a high level of sensitivity and accuracy while maintaining robustness and reliability (e.g., by minimizing false positives or false negatives).

Further, example techniques that may be executed as an ensemble pipeline may include a variety of techniques that may be generally more suitable and/or better optimized for detecting different types of defect and failure modalities such that the overall predictive power of a cumulative pipeline implementation may be enhanced. For example, template matching may be particularly advantageous in detecting larger defects such as, e.g., residual areas of unpolished tungsten at a post-CMP stage, in some implementations. Image differencing techniques may be optimized in some example implementations for detecting non-uniformity of wafers within a lot. As previously noted, uniformity or non-uniformity may be defined or obtained as a multivariate parameter or construct depending on the pixels values across all color channels within a certain range, e.g., ±5%, ±10%, etc., between two wafer images, between a wafer image and a reference image, between a wafer image and a template patch (e.g., a pixel array portion obtained from a historical reference image or otherwise, determined to be representative of a defect free wafer image), and the like. Blob detection techniques may be optimized in some example implementations for detecting anomalous regions across the wafers within a lot as well as within a single wafer. For example, a blob detection technique may be tuned for identifying a defect in a wafer lot where all the wafers in the lot have the same defect (e.g., due to all the wafers being processed in the same incorrect manner). Furthermore, standard deviation kernel convolution techniques set forth herein may be advantageously utilized for detecting texture/granularity differences across a wafer at certain process stages in a fabrication flow.

In an implementation involving 300 mm wafers, example image analysis techniques may be tuned to detect defect sizes of 2 mm or greater (up to, e.g., 200 mm or so), which may be generally termed "macro defects" in some arrangements. In general, example macro defects may comprise and/or be caused by, e.g., non-uniform exposure, solvent drips, residual matter after clean, striations, misplaced scribe or array positioning, resist bubbles, scratches, particulate matter, off-center resist dispense, peeling, etc.

Without limitation, set forth below are additional details with respect to an example ensemble of foregoing image analysis techniques according to some implementations of the present disclosure.

Figure 4:
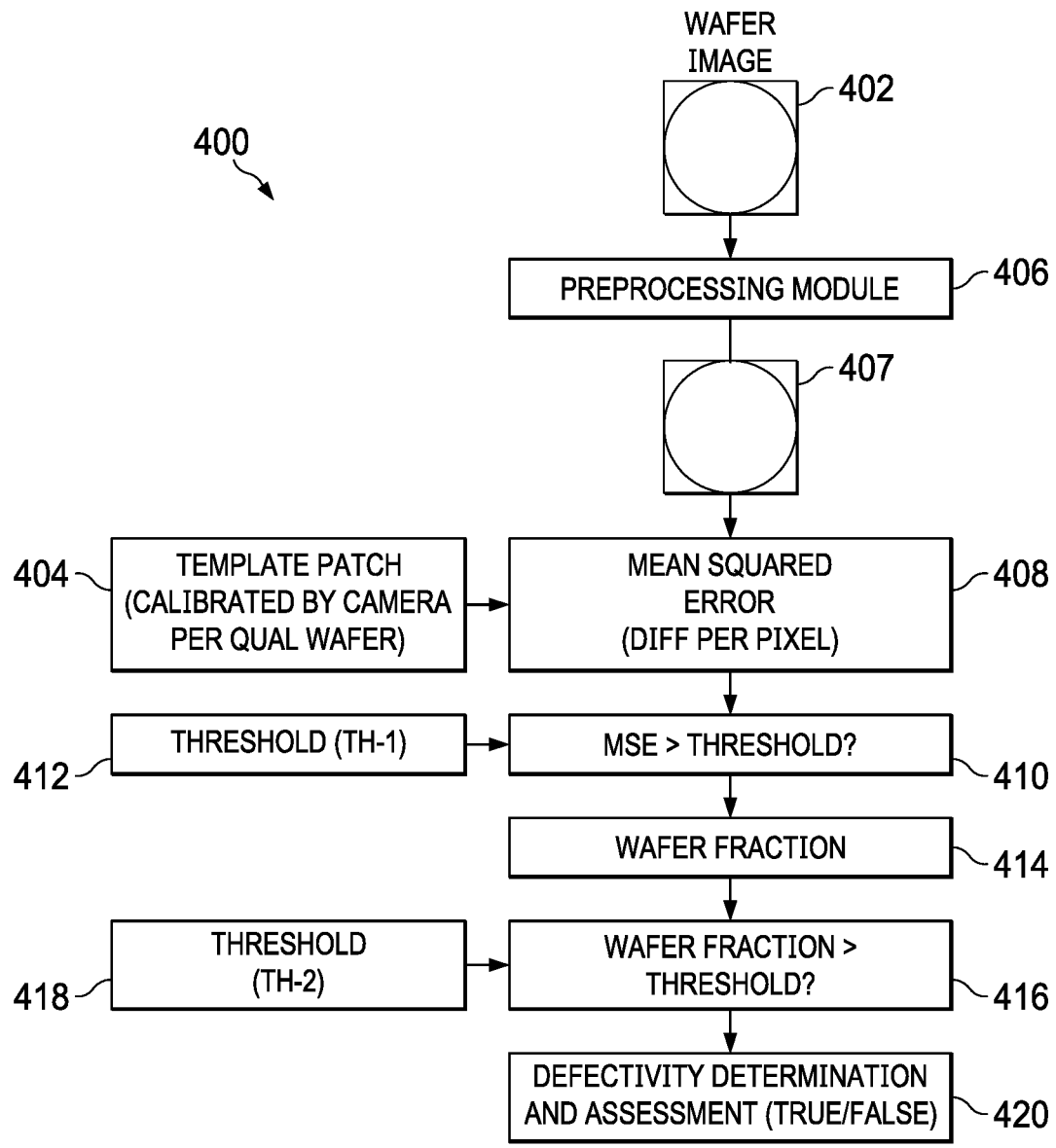
FIG. 4 depicts a block diagram of a template matching subsystem implemented as part of a wafer defect detection system according to some examples of the present disclosure.

FIG. 4 depicts a block diagram of a template matching subsystem 400 implemented as part of a wafer defect detection system according to some examples of the present disclosure. In one implementation, a wafer image 402 may be preprocessed by a preprocessing module 406 to obtain a preprocessed image 407, wherein a plurality of preprocessing operations may be performed as previously discussed. In one implementation, the preprocessed wafer image 407 may be compared against a template 404 comprising a patch of pixels deemed to be representative of an image or a portion thereof obtained from wafers processed at a targeted process step without any defects (or within a certain configurable guardband depending on the process step). In some arrangements, template patches corresponding to different process stages of a fabrication flow may be obtained over time, which may be curated, calibrated, classified and/or otherwise manipulated by human experts and/or AI/ML-based systems in some implementations as previously noted, which may be stored locally, on a private network (e.g., intranet), and/or on the Internet (e.g., as a cloud-based datacenter implementation). In some arrangements, template patches may be obtained from reference images selected from the wafers of different wafer lots processed at different stages.

In general, template selection and matching may be calibrated so as to eliminate, reduce, or otherwise mitigate the effects of certain known challenges in digital image processing, e.g., occlusion, detection of non-rigid transformations, illumination and background changes, background clutter and scale changes, etc. In an example arrangement, a template 404 of certain size may be qualified and/or calibrated in order to compensate for variable lighting, camera equipment quality, and miscellaneous differences that may exist between the image capturing system used in capturing the wafer image 402 and the image capturing system used in capturing images from which the template 404 is obtained.

In some examples, template matching subsystem 400 may be configured to perform a matching process for determining a suitable estimator that measures differences between the preprocessed wafer image 407 and the template 404 and utilizing the estimator in some manner for determining whether the inline wafer from which the image 402 was taken is defective. In one arrangement, template matching subsystem 400 may be configured to determine a mean squared error (MSE) or mean squared deviation (MSD) as an estimator 408 that measures the average of the squares of errors (e.g., the average squared difference between the pixel values of the preprocessed wafer image and the pixel values of the template 404). In one arrangement, the template patch 404 may be "stepped" across the preprocessed wafer image 407 in an iterative manner (depending on the relative sizes of the preprocessed image 407 and the template patch 404) to determine a plurality of MSEs (depending on how many steps are needed to cover the entire preprocessed wafer image 407 by the template patch 404), which may be combined using a suitable mathematical/statistical technique to obtain an MSE for the entire wafer image. Generally, the larger an MSE is, the larger is the difference between the preprocessed wafer image pixels and the template patch pixels. A determination block 410 may be configured to determine what fraction of the preprocessed wafer image contains an MSE that is greater than a first threshold (Th-1), which may be obtained from a domain expertise database 412, e.g., facilitated by human/AI/ML experts, etc. In one implementation, wafer fraction 414 having an MSE greater than the first threshold may be compared against a second threshold (Th-2) by a determination block 416 to determine whether the wafer fraction is greater than a preconfigured minimum value. Similar to obtaining Th-1, Th-2 may be obtained from a domain expertise database 418 facilitated by human/AI/ML experts. Responsive to the determinations performed at blocks 410 and 416, a wafer level defectivity determination may be performed by an assessment module 420, e.g., as a true/false designation, where in one implementation "true" indicates or otherwise classifies the inline wafer as "defective" and "false" indicates or otherwise classifies the inline wafer as "non-defective". Skilled artisans will recognize upon reference hereto that complementary Boolean logic and/or other types of ordinal data ranking may also be employed in some example implementations for designating defective/non-defective wafers based on a range of defectivities.

In some arrangements, template matching subsystem 400 may be adapted to perform a separate matching process across all three R/G/B color channels, channel by channel, each matching process having different or same thresholds, etc., wherein wafer level defectivity determination may be made by taking into consideration the overall MSEs in some cumulative manner, e.g., in a statistically weighted process. It should be appreciated that the foregoing matching process may be implemented in numerous ways, e.g., depending on the relative sizes of the preprocessed wafers images and template patches used, how MSEs are determined across the entire wafer image based on the techniques used in combining the MSEs, etc., which in turn may determine how different thresholds may be employed for facilitating the overall defectivity determinations in some arrangements. Accordingly, the thresholds used in an example template matching subsystem 400 may be tuned (e.g., based on trained neural networks, etc.) in order to minimize false positives, false negatives, or both, in a wafer defect detection system according to some implementations.

Figure 5:
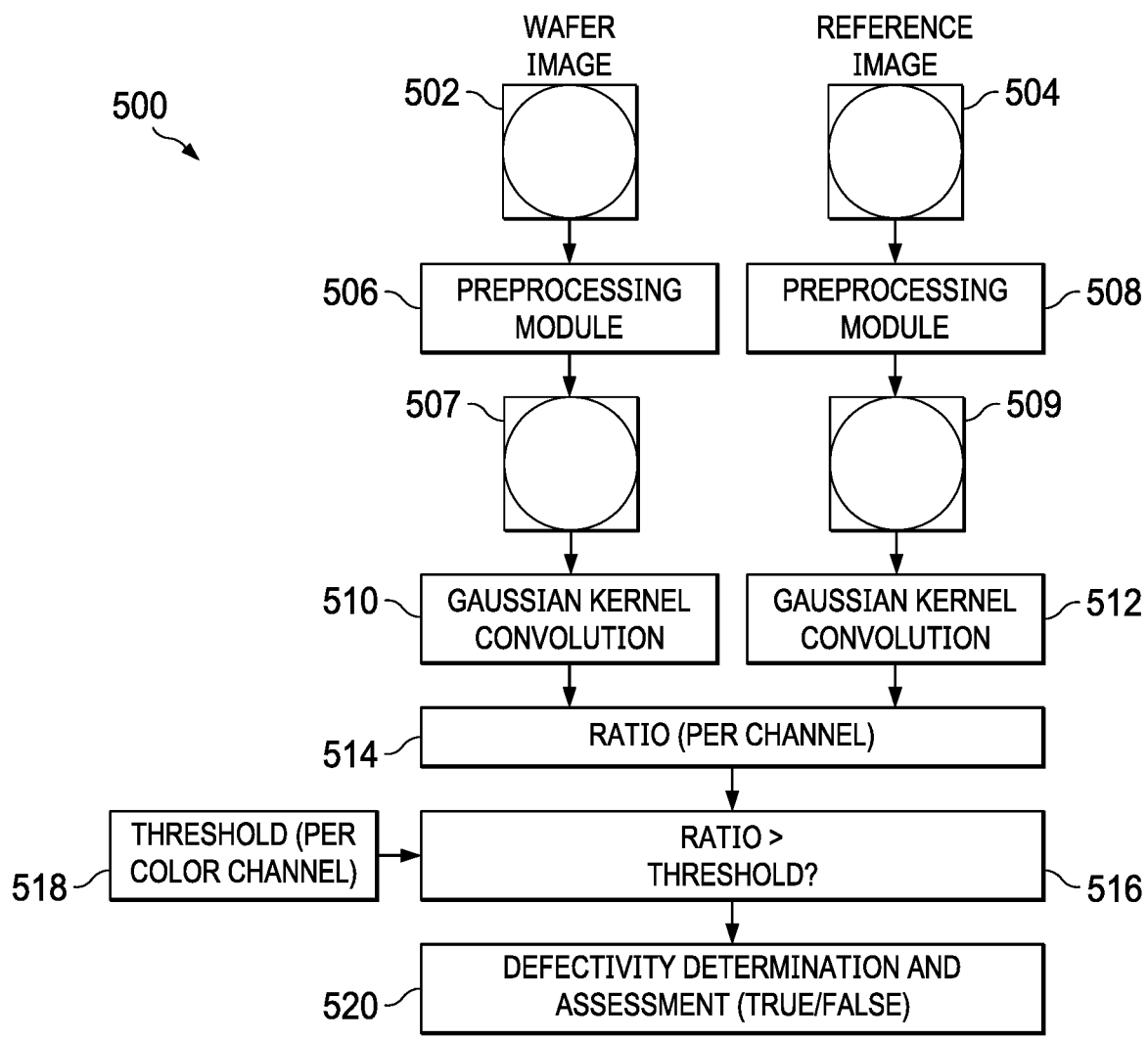
FIGS. 5 and 6 depict block diagrams of an image differencing subsystem implemented as part of a wafer defect detection system according to some examples of the present disclosure.
Figure 6:
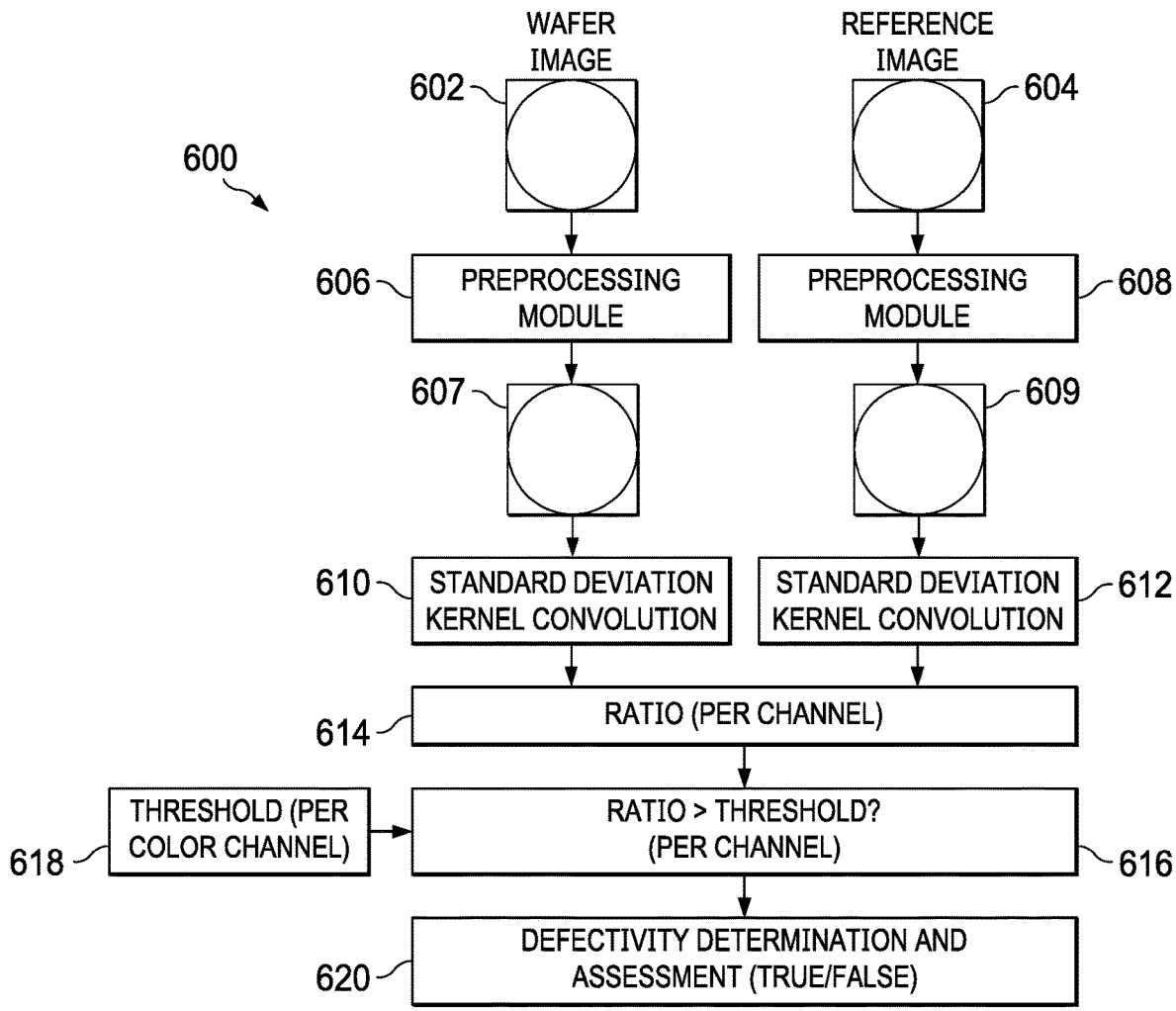

FIG. 5 depicts a block diagram of an image differencing subsystem 500 using Gaussian kernel convolution as an image analysis technique implemented as part of a wafer defect detection system according to some examples of the present disclosure. FIG. 6 depicts a block diagram of an image differencing subsystem 600 using standard deviation kernel convolution as an image analysis technique implemented as part of a wafer defect detection system according to some examples of the present disclosure. In general implementation, image convolution involves perturbing each element or pixel of an image portion based on its local neighboring pixels, weighted by a small matrix of pixels, called a kernel, convolution matrix, or mask, in order to facilitate operations such as blurring, sharpening, embossing, edge detection, etc. so that features on an image may be rendered in a better form for analysis, e.g., comparison, differencing, etc. In example arrangements of the present disclosure, image differencing may be implemented as an image processing technique for determining variations between the preprocessed wafer images and reference images, e.g., per color channel, which may be quantified based on any known or heretofore unknown mathematical and/or statistical techniques, e.g., a ratio analysis, for effectuating wafer level defectivity assessments on the basis of certain tunable/configurable thresholds.

In some example implementations, the difference between two images may be determined by obtaining the difference between each pixel in each image and generating an image based on the pixel differential values, which may be provided as an input to a difference quantifier. In some example implementations, the two images may be aligned such that corresponding pixel locations match, respectively, wherein the pixels' photometric values are also ensured to be compatible, e.g., by calibration, preprocessing, etc.

As illustrated in FIG. 5, a wafer image 502 and a reference image 504 may each be preprocessed by respective preprocessing modules 506, 508, which may execute identical or nearly identical preprocessing operations in some implementations, thereby obtaining a preprocessed wafer image 507 and a preprocessed reference image 509, respectively. Each preprocessed image 507, 509 may be convolved by a corresponding Gaussian kernel convolution module 510, 512, that may execute identical or nearly identical convolution operations using the same or substantially same kernel matrices. In one arrangement, a kernel matrix may be selected to represent the shape and size of a pixel's local neighborhood to be sampled when calculating a mean, wherein the kernel shape is a Gaussian curve having a particular standard deviation. In general, the effect of a Gaussian convolution operator is to smooth or blur the image to remove noise (e.g., as a low-pass filter), wherein the degree of smoothing is determined by the standard deviation of the Gaussian. In some arrangements, more smoothing of an image may be effectuated by increasing the kernel size. Relatedly, larger standard deviation Gaussians may require larger convolution kernels for accurate representation in some example implementations.

In one example implementation, Gaussian operators 510, 512 may output a weighted average of each pixel's neighborhood, with the average weighted more towards the value of the central pixels, in contrast to applying a mean filter's uniformly weighted average. Because of this property, Gaussian operators 510, 512 may be configured to provided a gentler smoothing operation, which preserves feature edges better than a similarly sized mean filter. According to some examples, Gaussian blurring may be effectuated to smooth out large areas of a wafer image across various underlying partially formed die structures and scribe lines in order to improve defect prediction accuracy for certain types of failure modes, e.g., involving post-CMP metal film compositions.

In one arrangement, a ratio operator 514 may be provided as a difference quantifier that is configured to measure a ratio between the respective Gaussian-perturbed output from Gaussian operators 510, 512, e.g., on a per-channel basis for the RGB channels. A tunable, configurable threshold per channel may be applied against the output from ratio operator 514 by a determination block 516 for facilitating defectivity assessment by a defectivity assessment module 520, e.g., as a true/false designation. Similar to the defectivity assessment operations set forth above in reference to the template matching scheme shown in FIG. 4, an example implementation may provide a designation of "true" to indicate or otherwise classify the inline wafer as "defective" and "false" to indicate or otherwise classify the inline wafer as "non-defective". Further, per-channel thresholds (e.g., three thresholds corresponding to the three color channels) may be obtained from a domain expertise database 518, e.g., facilitated by human/AI/ML experts, etc., similar to the Th-1 and Th-2 thresholds set forth in respect of the template matching scheme shown in FIG. 4.

In an example implementation of subsystem 500, minimum thresholds expressed as a fraction of the reference image that is considered different enough for detection may be set at [0.45; 0.50; 0.45], corresponding to the R/G/B channels, respectively. As to kernel sizes, channel-specific sizes may be provided in an example implementation, which may be represented in pixel sizes (e.g., as a square matrix of [K-by-K] pixels) or in some physical measurements such as, e.g., having a square shape with a side/length expressed in millimeters (mm). In an example implementation of system 500, a kernel size may be set at [40 mm; 40 mm; 40 mm] for the R/G/B channels, respectively.

Example image differencing subsystem 600 shown in FIG. 6 is illustrative of a system that uses standard deviation kernel convolution as an image analysis technique for purposes of the present disclosure. Skilled artisans will recognize upon reference hereto that subsystem 600 is substantially similar to the subsystem 500 described above except for convolution modules 610, 612 that operate on a preprocessed wafer image 607 and a preprocessed reference image 609, respectively, obtained from wafer image 602, reference image 604 by way of respective preprocessing modules 606, 608. As such, difference quantification module 614, per-channel threshold database module 618, defectivity assessment module 620 based on determinations by module 616 are substantially similar to the corresponding modules exemplified in subsystem 500 described above in detail, which description is equally applicable here, mutatis mutandis, and therefore will not be repeated.

In an example implementation, standard deviation kernel convolution modules 610, 612 may each be configured with a square kernel of appropriate size that may be stepped across the respective images 607, 609, wherein a standard deviation of the pixels within the kernel box may be determined and used for replacing the center pixel of the image. For example, if a square kernel is a [3×3] matrix that is started at a particular corner of image to be convolved, e.g., the top left corner, a standard deviation of the [3×3] pixels of the image may be determined, which is then used for replacing the middle pixel of the [3×3] box. This process may be repeated across the entire wafer image in order to obtain a full "standard deviation image". By executing standard deviation kernel convolution modules 610, 612, therefore, two standard deviation images may be obtained wherein the pixels of each image have been perturbed in the manner set forth above. In an example implementation, standard deviation kernel convolution modules 610, 612, may each be operative with a kernel size of [40 mm; 40 mm; 40 mm] for the R/G/B channels, respectively, although different kernels may be used in other variations.

In an example arrangement, the standard deviation images output by standard deviation kernel convolution modules 610, 612 may be analyzed in a differencing and quantification module, e.g., difference quantification module 614 based on a ratio of the images, similar to the operations effectuated by subsystem 500 described above. Further, example defectivity assessment module 620 may be configured as before to generate an assessment as to whether the inline wafer is defective or not based on a per-channel threshold setting with respect to the three ratios corresponding to the R/G/B colors, respectively, which in an example implementation may be set at [5.5; 4.5; 3.5].

According to some examples, image blurring/perturbation caused by the standard deviation kernel convolutions of subsystem 600 may be tuned to detect differences in texture across the wafers, which may be particularly advantageous in predicting certain types of failure modes with better accuracy, e.g., photoresist peeling or lift-off at a photolithography stage used in patterning any layers or films such as dielectric layers, metal layers, vias, contacts, polysilicon layers, etc.

In some example implementations, subsystems 500 and 600 may be integrated into a single pipeline module for computational efficiency, wherein different convolution engines may be executed on each of the preprocessed inline wafer and reference wafer images, thereby effectuating a plurality of image difference testing modalities on a per channel, per convolution type basis. In some example implementations, defectivity assessment modules 520, 620 may be configured to operate in response to the output from multiple testing modalities and arrive at a defectivity assessment based on the cumulative output.

Figure 7:
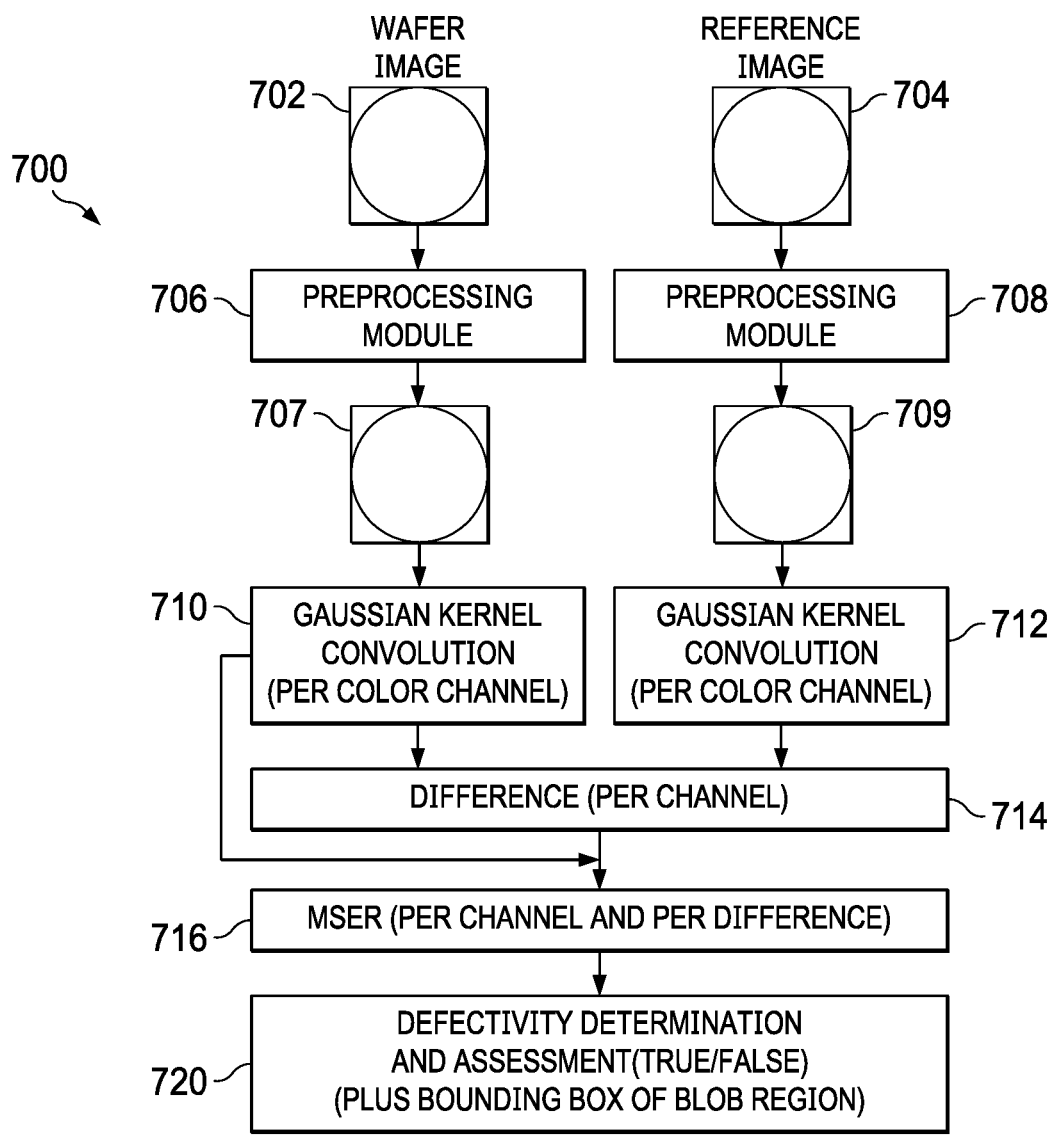
FIGS. 7 and 8 depict block diagrams of an region detection subsystem implemented as part of a wafer defect detection system according to some examples of the present disclosure.
Figure 8:
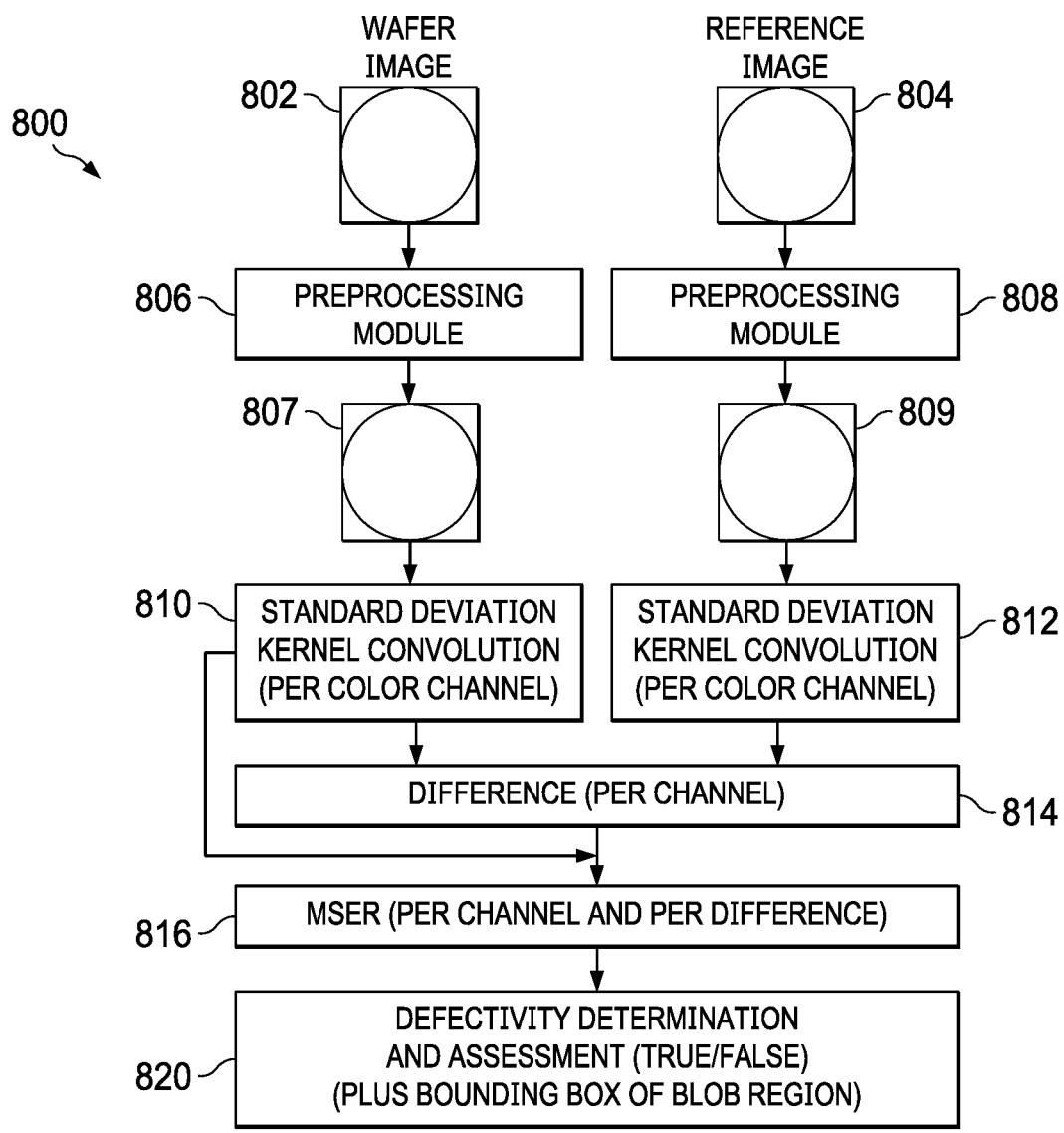

FIGS. 7 and 8 depict block diagrams of region/blob detection subsystems 700, 800 based on an MSER implementation that uses Gaussian kernel and standard deviation kernel convolutions, respectively, as part of a wafer defect detection system according to some examples of the present disclosure. In example implementations, MSER-based subsystems 700, 800 may be configured to detect regions or blobs of an image that differ in some property, e.g., intensity, brightness, or color, etc., compared to surrounding regions of the image. Generally, a blob may be considered as a region of an image in which a select property or set of properties are constant or approximately constant, in the sense that all the pixels in the blob are considered to be similar to each other. Convolution techniques similar to the convolution techniques employed in image differencing subsystems 500, 600, e.g., Gaussian kernel convolution and standard deviation kernel convolution, described above may be used in example region detection subsystems 700, 800 according to some implementations, although other types of convolutions may also be used in additional and/or alternative arrangements. Whereas template matching techniques may be generally better for detecting large area failure modes, e.g., a large fraction of the wafer having residual metal at a post-CMP stage, region detection subsystems 700, 800 may be tuned to be more sensitive to small defects comprising blobs or washer defects at various process stages. In some example arrangements, therefore, region detection subsystems 700, 800 may be used in conjunction with a template matching scheme in a complementary manner with respect to detecting certain types of failure modes, e.g., small amounts of residual metal, etc., in addition to other failure modes (e.g., photoresist peeling, washer defects, etc.) as will be set forth in detail further below.

In example arrangements of the present disclosure, an MSER module may be implemented (e.g., in Python OpenCV) for finding correspondences between image elements from different viewpoints, wherein multiple thresholds may be applied with respect to an image. If a region size is relatively invariant (e.g., the size does not change) within a specified range of threshold values based on certain parametric considerations, that region may be labeled "Maximally Stable" and considered a different region compared to the image elements (e.g., pixels) around it.

Similar to the other image analysis techniques set forth above, example MSER-based implementations herein may be configured to employ smoothing and related preprocessing techniques (e.g., to blur out scribe lines, underlying die structures, etc.) to improve defect detection and prediction accuracy as previously noted. As illustrated in FIG. 7, subsystem 700 may comprise Gaussian kernel convolution modules 710, 712, configured to operate on a preprocessed wafer image 707 and a preprocessed reference image 709, respectively, that are obtained from a wafer image 702 and a reference image 704 by way of respective preprocessing modules 706, 708. Depending on implementation, preprocessing modules 706, 708 may be integrated or otherwise configured so as to perform identical or substantially similar preprocessing operations with respect to images 702, 704, as previously noted. Further, convolution modules 710, 712 may be configured to execute convolution operations on a per color channel basis, wherein kernels having the same or different Gaussian distributions may be used for blurring. A differencing module 714 may receive the convolved images from convolution modules 710, 712 to generate a per-channel differential image output (e.g., wafer image minus the reference image or vice versa), which may be provided to an MSER module 716. In one arrangement, MSER module 716 may be configured to operate on the convolved wafer image output from convolution module 710 as well as the differential image output from differencing module 714, each on a per-channel basis (e.g., thereby resulting in six different MSER testing modalities) to generate an output that may be used for overall defectivity determination by an assessment module 718. In one arrangement, a wafer may be considered defective when at least one blob having a minimum threshold area is found in the wafer image corresponding thereto. In some additional and/or alternative arrangements, wafer images with blob regions surrounded by respective boundary boxes may also be presented for display, analysis, data warehousing, etc.

Example region detection subsystem 800 shown in FIG. 8 is substantially similar to the subsystem 700 described above except for convolution modules 810, 812 that are configured for performing standard deviation kernel convolution operations similar to the convolution operations performed by modules 610, 612 described above with respect to FIG. 6. In an example arrangement, convolution modules 810, 812 may be configured to operate on a preprocessed wafer image 807 and a preprocessed reference image 809, respectively, obtained from a wafer image 802, a reference image 804 by way of respective preprocessing modules 806, 808. As such, differencing module 814, MSER module 818, and defectivity determination and assessment module 818 are substantially similar to the corresponding modules exemplified in subsystem 700 described above in detail. Accordingly, relevant portions of the descriptions of FIGS. 6 and 7 are equally applicable here, mutatis mutandis, and therefore will not be repeated.

Similar to the subsystems 500 and 600 set forth above, subsystems 700 and 800 may be integrated into a single pipeline module in some example implementations for computational efficiency, wherein different convolution engines may be executed on each of the preprocessed inline wafer and reference wafer images such that an integrated MSER module (e.g., combining the functionalities of modules 716, 816) may be configured to effectuate a plurality of blob detection testing modalities on a per channel, per convolution type basis, with respect to the convolved image of the inline wafer and the differential image. In some example implementations, defectivity assessment modules 718/818 may be configured to operate in response to the output from multiple testing modalities and arrive at a defectivity assessment based on the cumulative output.

Depending on implementation, MSER-based subsystems 700, 800 may be configured or reconfigured to perform intra-wafer image analysis operations (e.g., to detect wafer defects or non-uniformities within a wafer, where a differential image between a convolved wafer image and a convolved reference image may not be used), multi-wafer image analysis operations (e.g., to detect wafer-to-wafer variations within a lot with respect to a reference image), or a combination thereof. Regardless of whether inter- or intra-wafer image analysis is implemented, additional (pre) processing may be performed in some MSER-based arrangements of the present disclosure, e.g., in addition to blurring, etc. In an example implementation, per-channel scalar multiplication operations may be performed on preprocessed wafer images and/or preprocessed reference images, wherein pixel intensities may be multiplied by certain scalar values, which may be determined empirically, heuristically or otherwise, that may tuned for providing better predictive accuracy. Table 1 below sets forth representative scalar values in an example implementation:

TABLE 1

| MSER Technique | Scalar for Red | Scalar for Green | Scalar for Blue |
| --- | --- | --- | --- |
| Intra-wafer Gaussian Kernel Convolution | 1.2 | 1.0 | 2.0 |
| Intra-wafer Std. Dev. Kernel Convolution | 0.16 | 0.16 | 0.5 |
| Multi-wafer Gaussian Kernel Convolution | 0.12 | 0.07 | 0.6 |
| Multi-wafer Std. Dev. Kernel Convolution | 0.002 | 0.0012 | 0.03 |

In some example arrangements, the scalar values may be obtained by observing the intensities of some sample images and calculating the scalars that would put the intensities roughly in the "middle" of the [0:255] intensity range, which may be used an input by an MSER module.

Further, certain parameters may be provided in example MSER-based image analysis subsystems of the present disclosure, which may need to be tuned, on a per-channel basis, depending on implementation. In general, one or more of the following parameters may provided in an example implementation: delta (which indicates how many color intensity levels does a region need to be stable for in order to be considered maximally stable); minArea, maxArea (if a region is maximally stable, it can still be rejected if it has less than ninArea pixels or more than maxArea pixels); maxVariation (if a region is maximally stable, it can still be rejected if the region's variation is larger than maxVariation); minDiversity (to prune regions that are too similar, e.g., differ for only a few pixels); and the like. By way of illustration, set forth below are representative delta parameters for respective color channels in an example implementation:

TABLE 2

| MSER Technique | Delta for Red | Delta for Green | Delta for Blue |
| --- | --- | --- | --- |
| Intra-wafer Gaussian Kernel Convolution | 4 | 4 | 4 |
| Intra-wafer Std. Dev. Kernel Convolution | 7 | 5 | 4 |

TABLE 2-continued

| MSER Technique | Delta for Red | Delta for Green | Delta for Blue |
| --- | --- | --- | --- |
| Multi-wafer Gaussian Kernel Convolution | 6 | 6 | 6 |
| Multi-wafer Std. Dev. Kernel Convolution | 8 | 8 | 8 |

Further, set forth below are representative maxVariation parameters for respective color channels in an example implementation:

TABLE 3

| MSER Technique | maxVar for Red | maxVar for Green | maxVar for Blue |
| --- | --- | --- | --- |
| Intra-wafer Gaussian Kernel Convolution | 0.2 | 0.2 | 0.2 |
| Intra-wafer Std. Dev. Kernel Convolution | 0.15 | 0.2 | 0.2 |
| Multi-wafer Gaussian Kernel Convolution | 0.15 | 0.15 | 0.15 |
| Multi-wafer Std. Dev. Kernel Convolution | 0.15 | 0.15 | 0.15 |

With respect to the convolution operations used in example MSER-based image analysis subsystems of the present disclosure, various kernel sizes may be provided depending on implementation. In one example implementation, Gaussian kernel convolution used in MSER for identifying within wafer defectivity may involve a kernel size set at [12 mm; 12 mm; 12 mm] for the R/G/B channels, respectively. In one example implementation, standard deviation kernel convolution used in MSER for identifying within wafer defectivity may involve a kernel with set at [10 mm; 10 mm; 10 mm] for the R/G/B channels, respectively. In similar fashion, Gaussian kernel convolution as well as standard deviation kernel convolution used in MSER for identifying defects across multiple wafers in a lot scheme may involve a kernel size set at [12 mm; 12 mm; 12 mm] for the R/G/B channels, respectively, according to some example implementations.

In some example arrangements, an image preprocessing pipeline may be configured to vary the sequence of the preprocessing techniques as previously noted, e.g., depending on which image analysis techniques may be involved in an ensemble sequence. In one implementation, some preprocessing techniques may be used first, e.g., removing the center shadow, followed by other preprocessing techniques that may be tailored based on the ensemble of image analysis techniques. For example, different edge maskings or exclusions may be performed in a subsequent step after the center shadow removal according to a representative arrangement. In an example implementation involving 300 mm wafers, various edge exclusions may be provided in a preprocessing stage that are specific to the different image analysis techniques. For example, the following edge exclusions may be implemented in one arrangement wherein an edge exclusion may be defined as the distance from the wafer edge towards the wafer center that is excluded from detection: (i) for template matching, a 50 mm edge exclusion; (ii) for image differencing based on Gaussian kernel convolution, a 60 mm edge exclusion; (iii) for image differencing based on standard deviation kern convolution, a 60 mm edge exclusion; (iv) for intra-wafer blob detection based on Gaussian kernel convolution, a 40 mm edge exclusion; (v) for intra-wafer block detection based on standard deviation kernel convolution, a 45 mm edge exclusion; (vi) for multi-wafer lot blob detection based on Gaussian kernel convolution, a 45 mm edge exclusion; and (vii) for multi-wafer block detection based on standard deviation kernel convolution, a 45 mm edge exclusion.

According to some example implementations, an MSER-based image analysis subsystem using Gaussian kernel convolutions may be particularly advantageous in detecting post-CMP metal layer defect modalities, e.g., a tungsten blob surrounded by a polished region, a polished blob with a residual tungsten region surrounding it, etc. Likewise, an MSER-based image analysis subsystem using standard deviation kernel convolutions may be tuned to facilitate texture-based defect modalities, e.g., photoresist lifting, residual tungsten, etc. Still further implementations of an MSER-based image analysis subsystem may be advantageous in detecting washer defects, which may comprise defects in an underlying structure, filled with tungsten, that cannot be polished away by CMP.

Figure 9A:
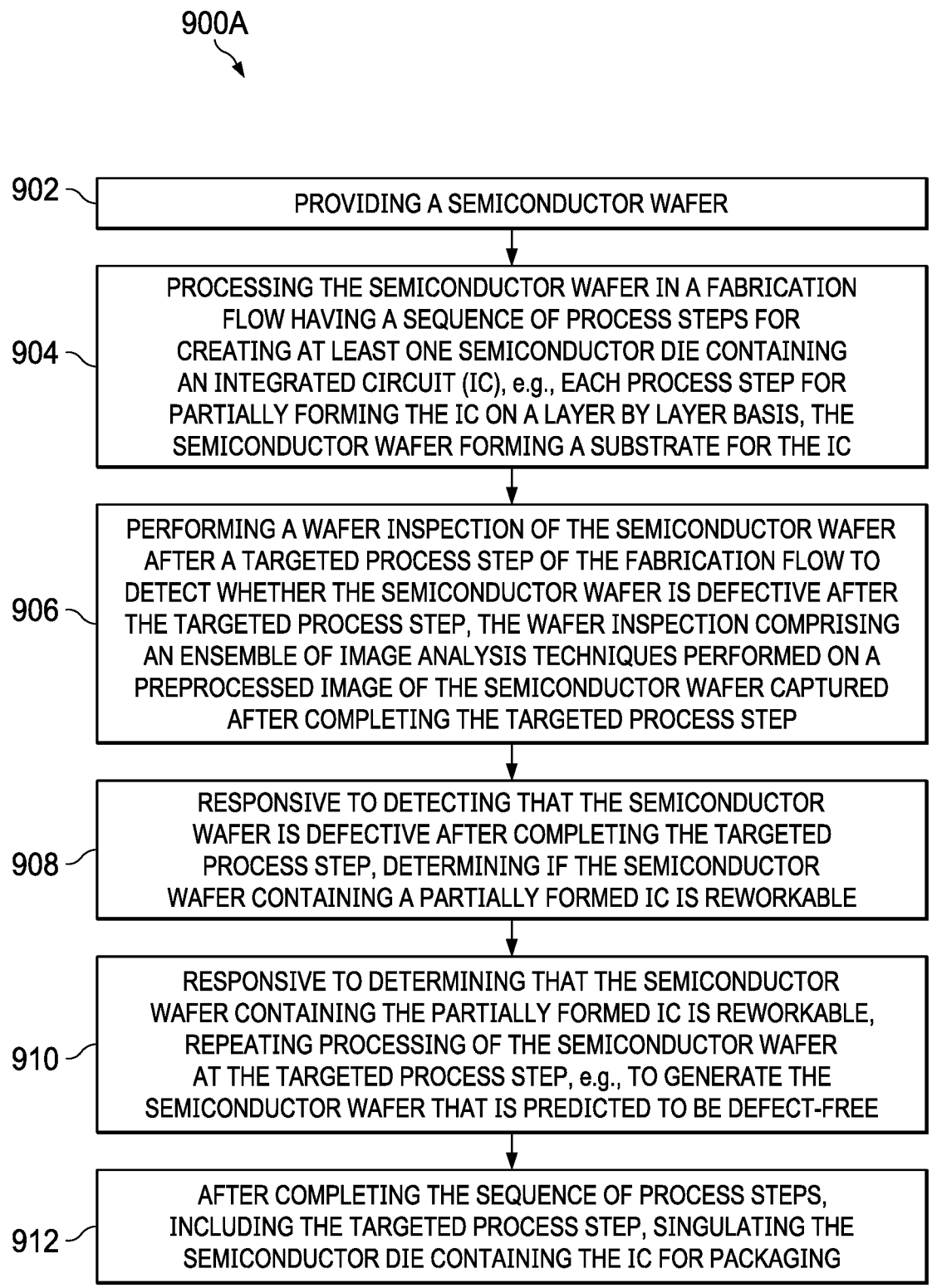
FIGS. 9A and 9B are flowcharts of a method according to some examples of the present disclosure.
Figure 9B:
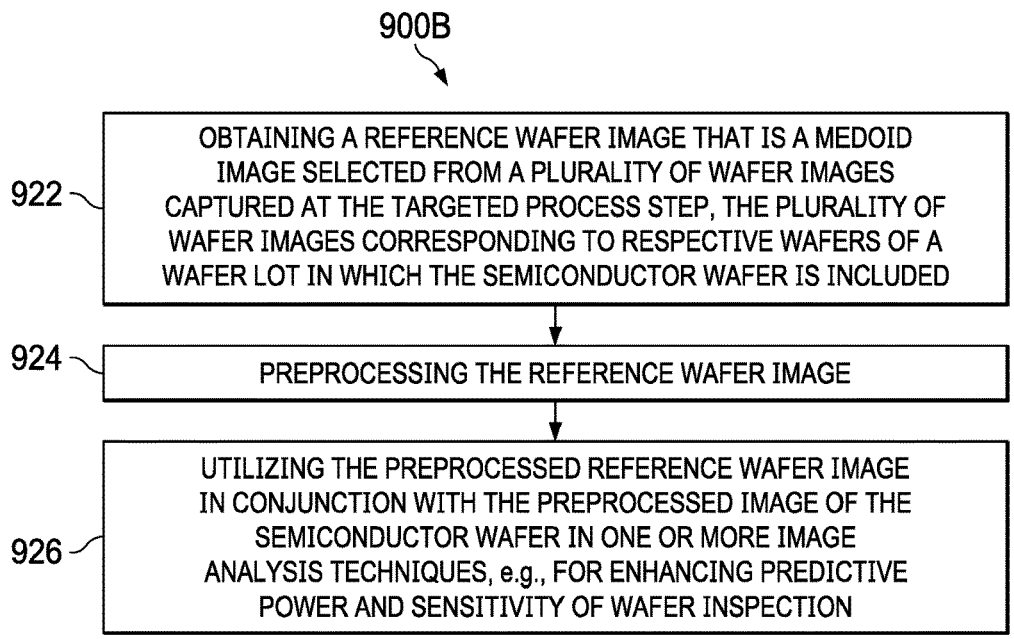

FIGS. 9A and 9B are flowcharts of methods according to some examples of the present disclosure, wherein illustrated blocks, steps and/or acts may be (re)combined in one or more arrangements with or without additional flowcharts of the present disclosure in some arrangements. Example process 900A shown in FIG. 9A is illustrative of a method of fabricating an integrated circuit (IC) on a semiconductor wafer processed based on wafer defectivity assessment according to some implementations. At block 902, a suitable semiconductor wafer for fabricating the IC is provided, which may comprise, e.g., without limitation, silicon, germanium, a III-V semiconductor material, or the like, and any suitable size (e.g., up to 450 mm or beyond). In one implementation, the semiconductor wafer may be processed in a fabrication flow having a sequence of process steps for creating at least one semiconductor die containing the IC, wherein each process step may be configured for partially forming the IC on a layer by layer basis, the semiconductor wafer forming a substrate for the IC, as set forth at block 904. During the processing of the semiconductor wafer, example method 900A may perform a wafer inspection of the semiconductor wafer at or after a targeted process step of the fabrication flow. For example, an automated or semi-automated inspection process may be configured to detect whether the semiconductor wafer is defective at or after the targeted process step. Block 906 of FIG. 9A is illustrative of the foregoing operations in some examples. In an example implementation, the wafer inspection may comprise performing an ensemble of image analysis techniques on a preprocessed image of the semiconductor wafer as set forth above in detail (block 906). At block 908, responsive to detecting that the semiconductor wafer is defective after completing the targeted process step, a determination may be made whether the semiconductor wafer containing a partially formed IC is reworkable. Responsive to determining that the semiconductor wafer containing the partially formed IC is reworkable, processing of the semiconductor wafer at the targeted process step may be repeated, e.g., in order to generate the semiconductor wafer that is predicted to be defect-free (block 910). After completing the sequence of process steps, including the targeted process step (including a rework if needed), the semiconductor die containing the IC may be singulated in a wafer dicing process for packaging, etc. (block 912).

Example process 900B shown in FIG. 9B is illustrative of a method used in a wafer inspection system of the present disclosure according to some implementations. At block 922, a reference wafer image may be obtained that is a medoid image selected from a plurality of wafer images captured at the targeted process step, wherein the plurality of wafer images correspond to respective wafers of a wafer lot in which the semiconductor wafer is included for processing. At block 924, the reference wafer image may be preprocessed. As set forth previously, the reference wafer image may be preprocessed in the same manner as that used in obtaining the preprocessed images of the semiconductor wafers in a lot, wherein the preprocessing may comprise performing at least one of edge mask operation, a center circle shadow replacement operation, and a circle-inverted mask replacement operation. At block 926, the preprocessed reference wafer image may be utilized in conjunction with the preprocessed image of the semiconductor wafer in one or more image analysis techniques, e.g., for enhancing the predictive power of a wafer inspection scheme according to some example implementations. As noted previously, using a medoid image from a wafer lot reduces the likelihood of false positives cause by artifacts that can occur when statistically doctored images are used.

Figure 10:
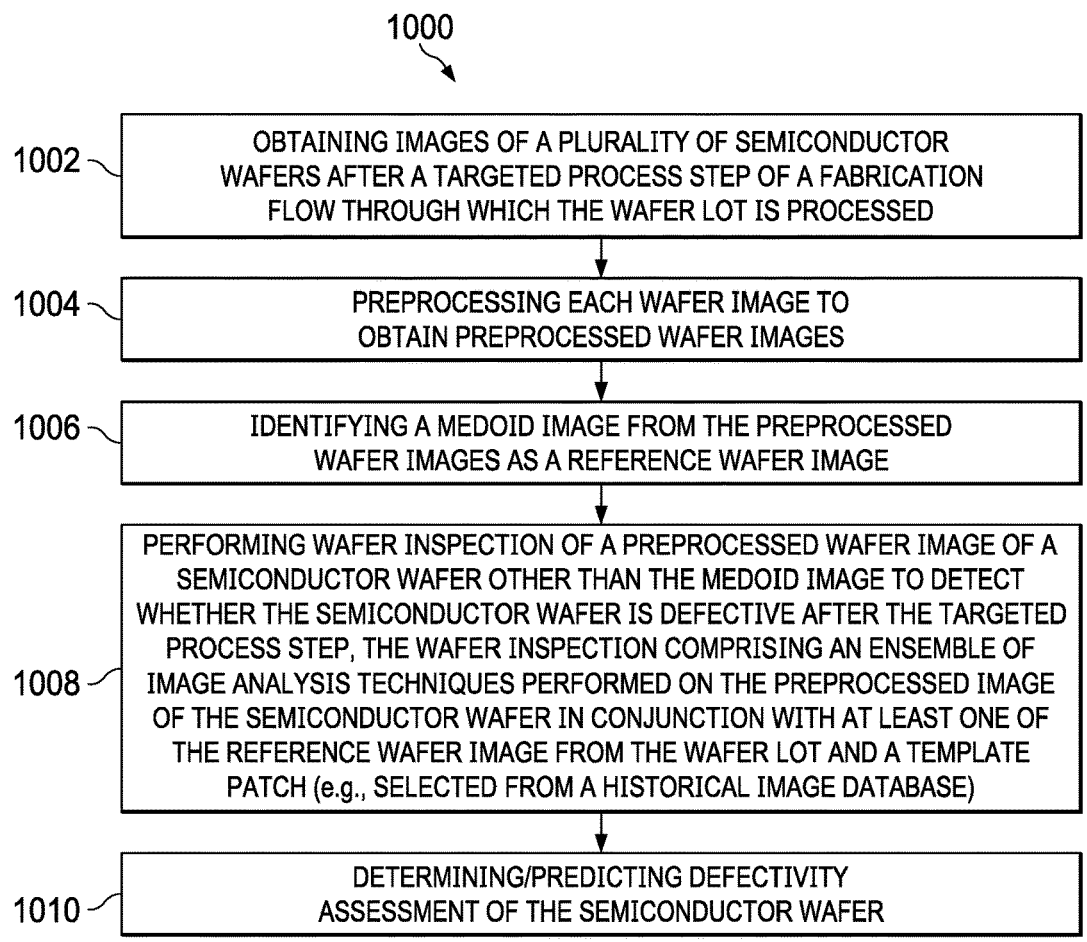
FIG. 10 is a flowchart of a method according to some examples of the present disclosure.

FIG. 10 is a flowchart of a method according to some examples of the present disclosure, wherein illustrated blocks, steps and/or acts may be (re)combined in one or more arrangements with or without additional flowcharts of the present disclosure in some arrangements. In one implementation, example process 1000 shown in FIG. 10 is illustrative of a method of detecting defects on a semiconductor wafer (e.g., a wafer defect detection method) that may be implemented as part of a wafer defectivity and rework assessment scheme according to some implementations. At block 1002, raw images of a plurality of semiconductor wafers (e.g., a wafer lot) processed after a targeted process step of a fabrication flow are captured, generated, or otherwise obtained. At block 1004, each wafer image may be preprocessed to obtain preprocessed wafer images. At block 1006, a medoid image may be selected, identified, or otherwise obtained from the preprocessed wafer images as a reference wafer image. At block 1008, a wafer inspection process of a preprocessed wafer image of a semiconductor wafer (e.g., other than the medoid image) may be performed to detect whether the semiconductor wafer is defective after the targeted process step. As described in detail hereinabove, an example wafer inspection scheme may comprise an ensemble of image analysis techniques performed on the preprocessed image of the semiconductor wafer in conjunction with at least one of the reference wafer image from the wafer lot and a template patch (e.g., selected from a historical image database). At block 1010, a defectivity assessment or prediction may be performed in response to the results obtained from the ensemble of image analysis techniques. In some arrangements, defectivity assessment may involve performing a weighted analysis of the various results obtained from the different techniques of the ensemble, e.g., depending on the fabrication process step or stage that is targeted for wafer inspection and monitoring.

In comparison with a baseline wafer defect detection system, an example of the present disclosure detected around 95% of the lots having residual tungsten defects whereas the baseline system detected around 35% of the lots with the residual tungsten defects (using a sample size of 20 lots). In another category, an example of the present disclosure detected around 71% of the lots with resist lifting defects whereas the baseline system detected around 29% of the lots (in a sample size of 7 lots).

At least some examples are described herein with reference to one or more circuit diagrams/schematics, block diagrams and/or flowchart illustrations. It is understood that such diagrams and/or flowchart illustrations, and combinations of blocks in the block diagrams and/or flowchart illustrations, can be implemented by any appropriate circuitry configured to achieve the desired functionalities. Accordingly, examples of the present disclosure may be embodied in hardware and/or in software (including firmware, resident software, micro-code, etc.) operating in conjunction with suitable processing units or microcontrollers, which may collectively be referred to as "circuitry," "a module" or variants thereof. An example processing unit or a module may include, by way of illustration, a general purpose processor, a special purpose processor, a conventional processor, a digital signal processor (DSP), an image processing engine or unit, a plurality of microprocessors, one or more microprocessors in association with a DSP core, a controller, a microcontroller, Application Specific Integrated Circuits (ASICs), Field Programmable Gate Array (FPGA) circuits, any other type of integrated circuit (IC), and/or a state machine, as well as programmable system devices (PSDs) employing system-on-chip (SoC) architectures that combine memory functions with programmable logic on a chip that is designed to work with a standard microcontroller. Example memory modules or storage circuitry may include volatile and/or non-volatile memories such as, e.g., random access memory (RAM), electrically erasable/programmable read-only memories (EEPROMs) or UV-EPROMS, one-time programmable (OTP) memories, Flash memories, static RAM (SRAM), etc.

Further, in at least some additional or alternative implementations, the functions/acts described in the blocks may occur out of the order shown in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Also, some blocks in the flowcharts may be optionally omitted. Furthermore, although some of the diagrams include arrows on communication paths to show a primary direction of communication, it is to be understood that communication may occur in the opposite direction relative to the depicted arrows. Finally, other blocks may be added/inserted between the blocks that are illustrated.

It should therefore be clearly understood that the order or sequence of the acts, steps, functions, components or blocks illustrated in any of the flowcharts and/or block diagrams depicted in the drawing Figures of the present disclosure may be modified, altered, replaced, customized or otherwise rearranged within a particular flowchart or block diagram, including deletion or omission of a particular act, step, function, component or block. Moreover, the acts, steps, functions, components or blocks illustrated in a particular flowchart may be inter-mixed or otherwise inter-arranged or rearranged with the acts, steps, functions, components or blocks illustrated in another flowchart in order to effectuate additional variations, modifications and configurations with respect to one or more processes for purposes of practicing the teachings of the present disclosure.

At least some portions of the foregoing description may include certain directional terminology, such as, e.g., "upper", "lower", "top", "bottom", "left-hand", "right-hand", "front side", "backside", "vertical", "horizontal", etc., which may be used with reference to the orientation of some of the Figures or illustrative elements thereof being described. Because components of some examples can be positioned in a number of different orientations, the directional terminology is used for purposes of illustration and is in no way limiting. Likewise, references to features referred to as "first", "second", etc., are not indicative of any specific order, importance, and the like, and such references may be interchanged mutatis mutandis, depending on the context, implementation, etc. Further, the features of examples described herein may be combined with each other unless specifically noted otherwise.

Although various implementations have been shown and described in detail, the claims are not limited to any particular implementation or example. None of the above Detailed Description should be read as implying that any particular component, element, step, act, or function is essential such that it must be included in the scope of the claims. Where the phrases such as "at least one of A and B" or phrases of similar import are recited or described, such a phrase should be understood to mean "only A, only B, or both A and B." Reference to an element in the singular is not intended to mean "one and only one" unless explicitly so stated, but rather "one or more." All structural and functional equivalents to the elements of the above-described implementations that are known to those of ordinary skill in the art are expressly incorporated herein by reference and are intended to be encompassed by the claims appended below.

What is claimed is:

1. A method of fabricating an integrated circuit (IC), the method comprising:
    processing a semiconductor wafer in a fabrication flow having a sequence of process steps for creating at least one semiconductor die containing the IC, the semiconductor wafer forming a substrate for the IC;
    after a targeted process step, performing a wafer inspection of the semiconductor wafer to detect whether the semiconductor wafer is defective after the targeted process step, the wafer inspection comprising an ensemble of image analysis techniques performed on a preprocessed image of the semiconductor wafer generated after completing the targeted process step and preprocessed to remove image artifacts;
    responsive to detecting that the semiconductor wafer is defective after completing the targeted process step, determining if the semiconductor wafer is reworkable;
    responsive to determining that the semiconductor wafer is reworkable, repeating the targeted process step for the semiconductor wafer after performing a rework process; and
    after completing the sequence of process steps, including the targeted process step, singulating the semiconductor die containing the IC for packaging.

2. The method as recited in claim 1, further comprising:
    obtaining a reference wafer image that is a medoid image selected from a plurality of wafer images captured at the targeted process step, the plurality of wafer images corresponding to respective wafers of a wafer lot in which the semiconductor wafer is included; and
    removing image artifacts from the reference wafer image thereby generating a preprocessed reference wafer image, and utilizing the preprocessed reference wafer image in conjunction with the preprocessed image of the semiconductor wafer in one or more image analysis techniques.

3. The method as recited in claim 2, wherein a raw image of the semiconductor wafer comprises a substantially square image containing a circular image portion corresponding to the semiconductor wafer, the preprocessed image of the semiconductor wafer is obtained by performing at least one of an edge mask operation, a center circle shadow replacement operation and a circle-inverted mask replacement operation with respect to the raw image of the semiconductor wafer.

4. The method as recited in claim 3, wherein the ensemble of image analysis techniques comprises a template matching process to determine (i) what fraction of the preprocessed image of the semiconductor wafer contains a mean squared error (MSE), when compared against a template patch, that is greater than a first threshold, (ii) whether the fraction of the preprocessed image of the semiconductor wafer having an MSE greater than the first threshold is greater than a second threshold, and (iii) a defectivity assessment of the semiconductor wafer responsive to the fraction of the preprocessed image of the semiconductor wafer being greater than the second threshold.

5. The method as recited in claim 3, wherein the ensemble of image analysis techniques comprises an image differencing process performed on the preprocessed image of the semiconductor wafer and the preprocessed reference wafer image, the image differencing process including:
performing a Gaussian kernel convolution of the preprocessed image of the semiconductor wafer and the preprocessed reference wafer image, respectively, to obtain two convolved images; and
determining defectivity of the semiconductor wafer based on a ratio of the two convolved images.

6. The method as recited in claim 3, wherein the ensemble of image analysis techniques comprises an image differencing process performed on the preprocessed image of the semiconductor wafer and the preprocessed reference wafer image, the image differencing process including:
performing a standard deviation kernel convolution of the preprocessed image of the semiconductor wafer and the preprocessed reference wafer image, respectively, to obtain two convolved images; and
determining defectivity of the semiconductor wafer based on a ratio of the two convolved images.

7. The method as recited in claim 3, wherein the ensemble of image analysis techniques comprises a region detection process based on a Maximally Stable Extremal Regions (MSER) scheme performed responsive to the preprocessed image of the semiconductor wafer and the preprocessed reference wafer image, the region detection process including performing at least one of Gaussian kernel convolutions and standard deviation kernel convolutions of the preprocessed image of the semiconductor wafer and the preprocessed reference wafer image, respectively, to determine defectivity of the semiconductor wafer.

8. The method as recited in claim 7, wherein the MSER scheme is performed, on a per-color channel, on at least one of (i) a convolved image corresponding to the preprocessed image of the semiconductor wafer, and (ii) a differential image derived as a difference between the convolved image corresponding to the preprocessed image of the semiconductor wafer and a convolved image corresponding to the preprocessed reference wafer image.

9. A method of detecting defects on a semiconductor wafer, comprising:
obtaining a plurality of wafer images of a corresponding plurality of semiconductor wafers of a wafer lot after a targeted process step of a fabrication flow through which the wafer lot is processed;
identifying a medoid image from the wafer images as a reference wafer image; and
performing a wafer inspection of a selected wafer image other than the medoid image to detect whether the a corresponding semiconductor wafer corresponding to the selected wafer image is defective after the targeted process step, the wafer inspection comprising an ensemble of image analysis techniques performed on the selected wafer image in conjunction with at least one of the reference wafer image and a template patch representative of a defect free wafer image.

10. The method as recited in claim 9, wherein raw images corresponding to the plurality of semiconductor wafers each comprise a substantially square image containing a circular image portion corresponding to the corresponding semiconductor wafer and the plurality of wafer images are obtained by performing at least one of an edge mask operation, a center circle shadow replacement operation and a circle-inverted mask replacement operation with respect to the corresponding raw image.

11. The method as recited in claim 10, wherein the ensemble of image analysis techniques comprises a template matching process to determine (i) what fraction of the selected wafer image contains a mean squared error (MSE), when compared against the template patch, that is greater than a first threshold, and (ii) whether the fraction is greater than a second threshold.

12. The method as recited in claim 10, wherein the ensemble of image analysis techniques comprises an image differencing process performed on the selected wafer image and the reference wafer image, the image differencing process including:
performing a Gaussian kernel convolution of the selected wafer image and the reference wafer image, respectively, to obtain two convolved images; and
determining defectivity of the semiconductor wafer corresponding to the selected wafer image based on a difference between the two convolved images.

13. The method as recited in claim 10, wherein the ensemble of image analysis techniques comprises an image differencing process performed on the selected wafer image and the reference wafer image, the image differencing process including:
performing a standard deviation kernel convolution of the selected wafer image and the reference wafer image, respectively, to obtain two convolved images; and
determining defectivity of the semiconductor wafer based on a difference between the two convolved images.

14. The method as recited in claim 10, wherein the ensemble of image analysis techniques comprises a region detection process based on a Maximally Stable Extremal Regions (MSER) scheme performed responsive to the selected wafer image of the semiconductor wafer and the reference wafer image, the region detection process including performing at least one of Gaussian kernel convolutions and standard deviation kernel convolutions of the selected wafer image and the reference wafer image, respectively, to determine defectivity of the semiconductor wafer corresponding to the selected wafer image.

15. The method as recited in claim 14, wherein the MSER scheme is performed, on a per-color channel, on at least one of (i) a convolved image corresponding to the selected wafer image, and (ii) a differential image derived as a difference between the convolved image corresponding to the selected wafer image and a convolved image corresponding to the reference wafer image.

16. A wafer defect detection apparatus, comprising:
an imaging system for capturing a plurality of raw images of a corresponding plurality of semiconductor wafers at a targeted process step of a fabrication flow, the plurality of semiconductor wafers forming a wafer lot processed through the fabrication flow; and a processing system coupled to the imaging system, the processing system including one or more processors and a persistent memory having program instructions that, when executed by the one or more processors, perform:

converting each wafer image from the plurality of raw images to a corresponding plurality of preprocessed wafer images that exclude one or more regions of the raw images;

identifying a medoid image from the preprocessed wafer images as a reference wafer image; and determining whether a semiconductor wafer of the plurality of semiconductor wafers is defective after the targeted process step based on an ensemble of image analysis techniques performed on the preprocessed wafer image corresponding to that semiconductor wafer in conjunction with at least one of the reference wafer image and a template patch representative of a defect free wafer image.

17. The apparatus as recited in claim 16, wherein a raw image of the semiconductor wafer captured by the imaging system comprises a low resolution image having a substantially square shape in which a circular image portion corresponding to the semiconductor wafer is contained, the program instructions comprising instructions configured to preprocess the raw image by performing at least one of an edge mask operation, a center circle shadow replacement operation and a circle-inverted mask replacement operation with respect to the raw image of the semiconductor wafer.

18. The apparatus as recited in claim 17, wherein the program instructions for performing the ensemble of image analysis techniques comprise program instructions to perform a template matching process is configured to determine (i) what fraction of the preprocessed image corresponding to the semiconductor wafer contains a mean squared error (MSE), when compared against the template patch, that is greater than a first threshold, and (ii) whether the fraction is greater than a second threshold.

19. The apparatus as recited in claim 17, wherein the program instructions for performing the ensemble of image analysis techniques comprise program instructions to perform an image differencing process using the preprocessed image corresponding to the semiconductor wafer and the reference wafer image, the image differencing process including:

performing a Gaussian kernel convolution of the preprocessed image of the semiconductor wafer and the reference wafer image, respectively, to obtain two convolved images; and determining defectivity of the semiconductor wafer based on a difference between the two convolved images.

20. The apparatus as recited in claim 17, wherein the program instructions for performing the ensemble of image analysis techniques comprise program instructions to perform an image differencing process using the preprocessed image corresponding to the semiconductor wafer and the reference wafer image, the image differencing process including:

performing a standard deviation kernel convolution of the preprocessed image of the semiconductor wafer and the reference wafer image, respectively, to obtain two convolved images; and determining defectivity of the semiconductor wafer based on a difference between of the two convolved images.

21. The apparatus as recited in claim 17, wherein the program instructions for performing the ensemble of image analysis techniques comprise program instructions to perform a region detection process based on a Maximally Stable Extremal Regions (MSER) scheme responsive to the preprocessed image of the semiconductor wafer and the reference wafer image, the region detection process including performing at least one of Gaussian kernel convolutions and standard deviation kernel convolutions of the preprocessed image of the semiconductor wafer and the reference wafer image, respectively, to determine defectivity of the semiconductor wafer.

22. The apparatus as recited in claim 21, wherein the MSER scheme is performed, on a per-color channel, on at least one of (i) a convolved image corresponding to the preprocessed image of the semiconductor wafer, and (ii) a differential image derived as a difference between the convolved image corresponding to the preprocessed image of the semiconductor wafer and a convolved image corresponding to the reference wafer image.

* * * * *